(12) United States Patent
Neufeld et al.

(10) Patent No.: US 11,322,599 B2
(45) Date of Patent: May 3, 2022

(54) ENHANCEMENT MODE III-NITRIDE DEVICES HAVING AN $AL_{1-x}SI_xO$ GATE INSULATOR

(71) Applicant: Transphorm Technology, Inc., Goleta, CA (US)

(72) Inventors: Carl Joseph Neufeld, Goleta, CA (US); Mo Wu, Goleta, CA (US); Toshihide Kikkawa, Goleta, CA (US); Umesh Mishra, Montecito, CA (US); Xiang Liu, Santa Barbara, CA (US); David Michael Rhodes, Santa Barbara, CA (US); John Kirk Gritters, Santa Barbara, CA (US); Rakesh K. Lal, Isla Vista, CA (US)

(73) Assignee: Transphorm Technology, Inc., Goleta, CA (US)

(*) Notice: Subject to any disclaimer, the term of this patent is extended or adjusted under 35 U.S.C. 154(b) by 320 days.

(21) Appl. No.: 16/070,238

(22) PCT Filed: Jan. 13, 2017

(86) PCT No.: PCT/US2017/013509
§ 371 (c)(1),
(2) Date: Jul. 13, 2018

(87) PCT Pub. No.: WO2017/123999
PCT Pub. Date: Jul. 20, 2017

(65) Prior Publication Data
US 2021/0043750 A1 Feb. 11, 2021

Related U.S. Application Data

(60) Provisional application No. 62/279,578, filed on Jan. 15, 2016.

(51) Int. Cl.
*H01L 29/778* (2006.01)
*H01L 29/66* (2006.01)
(Continued)

(52) U.S. Cl.
CPC ...... *H01L 29/517* (2013.01); *H01L 21/02145* (2013.01); *H01L 21/02271* (2013.01);
(Continued)

(58) Field of Classification Search
None
See application file for complete search history.

(56) References Cited

U.S. PATENT DOCUMENTS 4,300,091 A  11/1981  Schade, Jr.
4,532,439 A  7/1985  Koike
(Continued)

FOREIGN PATENT DOCUMENTS

CN  1596477  3/2005
CN  1748320  3/2006
(Continued)

OTHER PUBLICATIONS

Komatsu, N. "Characterization of Si-added aluminum oxide (AlSiO) films for power devices" App. Surf. Sci. 256, Oct. 14, 2009 pp. 1803-1806 (Year: 2009).*
(Continued)

*Primary Examiner* — Grant S Withers
(74) *Attorney, Agent, or Firm* — Fish & Richardson P.C.

(57) ABSTRACT

A transistor includes a III-N channel layer; a III-N barrier layer on the III-N channel layer; a source contact and a drain contact, the source and drain contacts electrically coupled to the III-N channel layer; an insulator layer on the III-N barrier layer; a gate insulator partially on the insulator layer and partially on the III-N channel layer, the gate insulator including an amorphous $Al_{1-x}Si_xO$ layer with 0.2<x<0.8;
(Continued)

and a gate electrode over the gate insulator, the gate electrode being positioned between the source and drain contacts.

22 Claims, 12 Drawing Sheets

(51) Int. Cl.
    *H01L 29/51*     (2006.01)
    *H01L 21/02*     (2006.01)
    *H01L 21/28*     (2006.01)
    *H01L 21/324*     (2006.01)
    *H01L 29/20*     (2006.01)
    *H01L 29/205*     (2006.01)
    *H01L 29/423*     (2006.01)
    *H01L 29/49*     (2006.01)

(52) U.S. Cl.
    CPC .... *H01L 21/28264* (2013.01); *H01L 21/3245* (2013.01); *H01L 29/2003* (2013.01); *H01L 29/205* (2013.01); *H01L 29/42364* (2013.01); *H01L 29/4916* (2013.01); *H01L 29/4966* (2013.01); *H01L 29/66462* (2013.01); *H01L 29/7786* (2013.01); *H01L 29/7787* (2013.01)

(56) References Cited

U.S. PATENT DOCUMENTS

| | | |
|---|---|---|
| 4,645,562 A | 2/1987 | Liao et al. |
| 4,665,508 A | 5/1987 | Chang |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,429,468 B1 | 8/2002 | Hsu et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,552,373 B2 | 4/2003 | Ando et al. |
| 6,580,101 B2 | 6/2003 | Yoshida |
| 6,583,454 B2 | 6/2003 | Sheppard et al. |
| 6,586,781 B2 | 7/2003 | Wu et al. |
| 6,624,452 B2 | 9/2003 | Yu et al. |
| 6,633,195 B2 | 10/2003 | Baudelot et al. |
| 6,649,497 B2 | 11/2003 | Ring |
| 6,727,531 B1 | 4/2004 | Redwing et al. |
| 6,746,938 B2 | 6/2004 | Uchiyama et al. |
| 6,777,278 B2 | 8/2004 | Smith |
| 6,849,882 B2 | 2/2005 | Chavarkar et al. |
| 6,867,078 B1 | 3/2005 | Green et al. |
| 6,914,273 B2 | 7/2005 | Ren et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,038,252 B2 | 5/2006 | Saito et al. |
| 7,045,404 B2 | 5/2006 | Sheppard et al. |
| 7,053,413 B2 | 5/2006 | D'Evelyn et al. |
| 7,071,498 B2 | 7/2006 | Johnson et al. |
| 7,078,743 B2 | 7/2006 | Murata et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,169,634 B2 | 1/2007 | Zhao et al. |
| 7,170,111 B2 | 1/2007 | Saxler |
| 7,199,640 B2 | 4/2007 | De Cremoux et al. |
| 7,217,960 B2 | 5/2007 | Ueno et al. |
| 7,230,284 B2 | 6/2007 | Parikh et al. |
| 7,238,560 B2 | 7/2007 | Sheppard et al. |
| 7,250,641 B2 | 7/2007 | Saito et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,375,407 B2 | 5/2008 | Yanagihara et al. |
| 7,382,001 B2 | 6/2008 | Beach |
| 7,388,236 B2 | 6/2008 | Wu et al. |
| 7,419,892 B2 | 9/2008 | Sheppard et al. |
| 7,429,534 B2 | 9/2008 | Gaska et al. |
| 7,432,142 B2 | 10/2008 | Saxler et al. |
| 7,436,001 B2 | 10/2008 | Eee et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,465,997 B2 | 12/2008 | Kinzer et al. |
| 7,482,788 B2 | 1/2009 | Yang |
| 7,488,992 B2 | 2/2009 | Robinson |
| 7,501,669 B2 | 3/2009 | Parikh et al. |
| 7,501,670 B2 | 3/2009 | Murphy |
| 7,508,014 B2 | 3/2009 | Tanimoto |
| 7,544,963 B2 | 6/2009 | Saxler |
| 7,547,925 B2 | 6/2009 | Wong et al. |
| 7,548,112 B2 | 6/2009 | Sheppard |
| 7,550,781 B2 | 6/2009 | Kinzer et al. |
| 7,550,783 B2 | 6/2009 | Wu et al. |
| 7,550,784 B2 | 6/2009 | Saxler et al. |
| 7,566,580 B2 | 7/2009 | Keller et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,601,993 B2 | 10/2009 | Hoshi et al. |
| 7,605,017 B2 | 10/2009 | Hayashi et al. |
| 7,612,363 B2 | 11/2009 | Takeda et al. |
| 7,612,390 B2 | 11/2009 | Saxler et al. |
| 7,615,774 B2 | 11/2009 | Saxler |
| 7,629,627 B2 | 12/2009 | Mil'shtein et al. |
| 7,638,818 B2 | 12/2009 | Wu et al. |
| 7,655,962 B2 | 2/2010 | Simin et al. |
| 7,678,628 B2 | 3/2010 | Sheppard et al. |
| 7,692,263 B2 | 4/2010 | Wu et al. |
| 7,700,973 B2 | 4/2010 | Shen et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,723,739 B2 | 5/2010 | Takano et al. |
| 7,728,356 B2 | 6/2010 | Suh et al. |
| 7,745,851 B2 | 6/2010 | Harris |
| 7,755,108 B2 | 7/2010 | Kuraguchi |
| 7,759,699 B2 | 7/2010 | Beach |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,622 B2 | 9/2010 | Kikkawa et al. |
| 7,795,642 B2 | 9/2010 | Suh et al. |
| 7,811,872 B2 | 10/2010 | Hoshi et al. |
| 7,812,369 B2 | 10/2010 | Chini et al. |
| 7,834,380 B2 | 11/2010 | Ueda et al. |
| 7,851,825 B2 | 12/2010 | Suh et al. |

(56) References Cited

U.S. PATENT DOCUMENTS

| | | |
|---|---|---|
| 7,855,401 B2 | 12/2010 | Sheppard et al. |
| 7,859,014 B2 | 12/2010 | Nakayama et al. |
| 7,859,020 B2 | 12/2010 | Kikkawa et al. |
| 7,859,021 B2 | 12/2010 | Kaneko |
| 7,875,537 B2 | 1/2011 | Suvorov et al. |
| 7,875,907 B2 | 1/2011 | Honea et al. |
| 7,875,910 B2 | 1/2011 | Sheppard et al. |
| 7,875,914 B2 | 1/2011 | Sheppard |
| 7,884,394 B2 | 2/2011 | Wu et al. |
| 7,884,395 B2 | 2/2011 | Saito |
| 7,892,974 B2 | 2/2011 | Ring et al. |
| 7,893,424 B2 | 2/2011 | Eichler et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,932,539 B2 | 4/2011 | Chen et al. |
| 7,935,985 B2 | 5/2011 | Mishra et al. |
| 7,939,391 B2 | 5/2011 | Suh et al. |
| 7,948,011 B2 | 5/2011 | Rajan et al. |
| 7,955,918 B2 | 6/2011 | Wu et al. |
| 7,955,984 B2 | 6/2011 | Ohki |
| 7,956,383 B2 | 6/2011 | Kuroda et al. |
| 7,960,756 B2 | 6/2011 | Sheppard et al. |
| 7,961,482 B2 | 6/2011 | Ribarich |
| 7,965,126 B2 | 6/2011 | Honea et al. |
| 7,973,335 B2 | 7/2011 | Okamoto et al. |
| 7,982,242 B2 | 7/2011 | Goto |
| 7,985,986 B2 | 7/2011 | Heikman et al. |
| 7,985,987 B2 | 7/2011 | Kaneko |
| 8,039,352 B2 | 10/2011 | Mishra et al. |
| 8,044,380 B2 | 10/2011 | Lee |
| 8,049,252 B2 | 11/2011 | Smith et al. |
| 8,076,698 B2 | 12/2011 | Ueda et al. |
| 8,076,699 B2 | 12/2011 | Chen et al. |
| 8,093,606 B2 | 1/2012 | Sonobe et al. |
| 8,110,425 B2 | 2/2012 | Yun |
| 8,114,717 B2 | 2/2012 | Palacios et al. |
| 8,153,515 B2 | 4/2012 | Saxler |
| 8,174,048 B2 | 5/2012 | Beach |
| 8,178,900 B2 | 5/2012 | Kurachi et al. |
| 8,223,458 B2 | 7/2012 | Mochizuki et al. |
| 8,237,196 B2 | 8/2012 | Saito |
| 8,237,198 B2 | 8/2012 | Wu et al. |
| 8,264,003 B2 | 9/2012 | Herman |
| 8,361,816 B2 | 1/2013 | Lee et al. |
| 8,363,437 B2 | 1/2013 | Wang et al. |
| 8,389,975 B2 | 3/2013 | Kikuchi et al. |
| 8,389,977 B2 | 3/2013 | Chu et al. |
| 8,390,000 B2 | 3/2013 | Chu et al. |
| 8,404,042 B2 | 3/2013 | Mizuhara et al. |
| 8,431,960 B2 | 4/2013 | Beach et al. |
| 8,455,885 B2 | 6/2013 | Keller et al. |
| 8,471,267 B2 | 6/2013 | Hayashi et al. |
| 8,476,125 B2 | 7/2013 | Khan et al. |
| 8,492,779 B2 | 7/2013 | Lee |
| 8,502,323 B2 | 8/2013 | Chen |
| 8,519,438 B2 | 8/2013 | Mishra et al. |
| 8,524,562 B2 | 9/2013 | Wang et al. |
| 8,525,231 B2 | 9/2013 | Park et al. |
| 8,530,904 B2 | 9/2013 | Treu et al. |
| 8,598,937 B2 | 12/2013 | Lal et al. |
| 8,603,880 B2 | 12/2013 | Yamada |
| 8,614,460 B2 | 12/2013 | Matsushita |
| 8,652,948 B2 | 2/2014 | Horie et al. |
| 8,674,407 B2 | 3/2014 | Ando et al. |
| 8,698,198 B2 | 4/2014 | Kuraguchi |
| 8,716,141 B2 | 5/2014 | Dora et al. |
| 8,742,460 B2 | 6/2014 | Mishra et al. |
| 8,772,832 B2 | 7/2014 | Boutros |
| 8,785,305 B2 | 7/2014 | Ramdani |
| 8,803,246 B2 | 8/2014 | Wu et al. |
| 2003/0006437 A1 | 1/2003 | Mizuta et al. |
| 2003/0030056 A1 | 2/2003 | Callaway, Jr. |
| 2004/0119067 A1 | 6/2004 | Weeks, Jr. et al. |
| 2005/0133816 A1 | 6/2005 | Fan et al. |
| 2005/0189559 A1 | 9/2005 | Saito et al. |
| 2006/0076677 A1 | 4/2006 | Daubenspeck et al. |
| 2006/0145189 A1 | 7/2006 | Beach |
| 2006/0189109 A1 | 8/2006 | Fitzgerald |
| 2006/0202272 A1 | 9/2006 | Wu et al. |
| 2006/0226442 A1 | 10/2006 | Zhang et al. |
| 2007/0018199 A1 | 1/2007 | Sheppard et al. |
| 2007/0045670 A1 | 3/2007 | Kuraguchi |
| 2007/0128743 A1 | 6/2007 | Huang et al. |
| 2007/0131968 A1 | 6/2007 | Morita et al. |
| 2007/0145417 A1 | 6/2007 | Brar et al. |
| 2007/0205433 A1 | 9/2007 | Parikh et al. |
| 2007/0210329 A1 | 9/2007 | Goto |
| 2007/0228477 A1 | 10/2007 | Suzuki et al. |
| 2007/0249119 A1 | 10/2007 | Saito |
| 2007/0295985 A1 | 12/2007 | Weeks, Jr. et al. |
| 2008/0001173 A1* | 1/2008 | Kiewra ............... H01L 29/7787 257/194 |
| 2008/0073670 A1 | 3/2008 | Yang et al. |
| 2008/0272397 A1 | 11/2008 | Koudymov et al. |
| 2008/0308813 A1 | 12/2008 | Suh et al. |
| 2009/0045438 A1 | 2/2009 | Inoue et al. |
| 2009/0050936 A1 | 2/2009 | Oka |
| 2009/0072269 A1 | 3/2009 | Suh et al. |
| 2009/0075455 A1 | 3/2009 | Mishra |
| 2009/0085065 A1 | 4/2009 | Mishra et al. |
| 2009/0140262 A1 | 6/2009 | Ohki et al. |
| 2010/0025730 A1 | 2/2010 | Heikman et al. |
| 2010/0044752 A1 | 2/2010 | Marui |
| 2010/0065824 A1 | 3/2010 | Wang et al. |
| 2010/0065923 A1 | 3/2010 | Charles et al. |
| 2010/0133506 A1 | 6/2010 | Nakanishi et al. |
| 2010/0203234 A1 | 8/2010 | Anderson et al. |
| 2010/0219445 A1 | 9/2010 | Yokoyama et al. |
| 2011/0012110 A1 | 1/2011 | Sazawa et al. |
| 2011/0108885 A1 | 5/2011 | Sazawa et al. |
| 2011/0147710 A1 | 6/2011 | Dewey et al. |
| 2011/0263102 A1 | 10/2011 | Heikman et al. |
| 2012/0217512 A1 | 8/2012 | Renaud |
| 2012/0235160 A1* | 9/2012 | Heikman .......... H01L 29/66462 257/76 |
| 2012/0267637 A1 | 10/2012 | Jeon et al. |
| 2013/0056744 A1 | 3/2013 | Mishra et al. |
| 2013/0328061 A1 | 12/2013 | Chu et al. |
| 2014/0015019 A1 | 1/2014 | Okamoto et al. |
| 2014/0084346 A1 | 3/2014 | Tajiri |
| 2014/0099757 A1 | 4/2014 | Parikh et al. |
| 2014/0264370 A1 | 9/2014 | Keller et al. |
| 2014/0264431 A1 | 9/2014 | Lal |
| 2014/0264455 A1 | 9/2014 | Keller et al. |
| 2016/0365435 A1* | 12/2016 | Then ............... H01L 29/66446 |

FOREIGN PATENT DOCUMENTS

| | | |
|---|---|---|
| CN | 101107713 | 1/2008 |
| CN | 101312207 | 11/2008 |
| CN | 101897029 | 11/2010 |
| CN | 102017160 | 4/2011 |
| CN | 102171830 | 8/2011 |
| CN | 103477543 | 12/2013 |
| CN | 103493206 | 1/2014 |
| CN | 103545352 | 1/2014 |
| EP | 1 998 376 | 12/2008 |
| EP | 2 188 842 | 5/2010 |
| JP | 09-306926 | 11/1997 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-253620 | 9/2004 |
| JP | 2004-260114 | 9/2004 |
| JP | 2006-032749 | 2/2006 |
| JP | 2006-033723 | 2/2006 |
| JP | 2007-036218 | 2/2007 |

(56) References Cited

FOREIGN PATENT DOCUMENTS

| | | |
|---|---|---|
| JP | 2007-505501 | 3/2007 |
| JP | 2007-215331 | 8/2007 |
| JP | 2008-091699 | 4/2008 |
| JP | 2008-199771 | 8/2008 |
| JP | 2008-243848 | 10/2008 |
| JP | 2009-503815 | 1/2009 |
| JP | 2009-524242 | 6/2009 |
| JP | 2010-087076 | 4/2010 |
| JP | 2010-093247 | 4/2010 |
| JP | 2010-525023 | 7/2010 |
| JP | 2010-539712 | 12/2010 |
| JP | 2011-529639 | 12/2011 |
| JP | 2014-022413 | 2/2014 |
| KR | 2011-0033584 | 3/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| TW | 201543680 | 11/2015 |
| WO | WO 2004/070791 | 8/2004 |
| WO | WO 2004/098060 | 11/2004 |
| WO | WO 2005/036749 | 4/2005 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/014128 | 2/2010 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |
| WO | WO 2015/147802 | 10/2015 |

OTHER PUBLICATIONS

Robertson (Robertson, J. "High dielectric constant gate oxides for metal oxide Si transistors" Rep. Prog. Phys. 69, Dec. 14, 2005 p. 327-396 (Year: 2005).*
Apblett, A. "Chemical Vapour Deposition of Aluminum Silicate Thin Films" J. Mater. Chem. 1, 1, published in the year 1991, pp. 143-144 (Year: 1991).*
Notice of Reasons for Rejection in JP Application No. 2018-536814, dated Mar. 23, 2021, 3 pages.
Notice of Reasons for Rejection in JP Application No. 2018-536814, dated May 26, 2020, 18 pages.
Search Report in TW Application No. 106101373, dated May 29, 2020, 2 pages.
Notification of First Office Action in CN Application No. 201780006717.9, dated Dec. 8, 2020, 16 pages.
Notice of Reasons for Rejection in JP Application No. 2018-536814, dated Dec. 16, 2020, 7 pages.
Authorized officer Chung Keun Lee, International Search Report and Written Opinion in PCT/US2008/076030, dated Mar. 23, 2009, 10 pages.
Authorized officer Yolaine Cussac, International Preliminary Report on Patentability in PCT/US2008/076030, dated Mar. 25, 2010, 5 pages.
Authorized officer Chung Keun Lee, International Search Report and Written Opinion in PCT/US2008/076079, dated Mar. 20, 2009, 11 pages.
Authorized officer Nora Lindner, International Preliminary Report on Patentability in PCT/US2008/076079, dated Apr. 1, 2010, 6 pages.
Authorized officer Keon Hyeong Kim, International Search Report and Written Opinion in PCT/US2008/076160 dated Mar. 18, 2009, 11 pages.
Authorized officer Simin Baharlou, International Preliminary Report on Patentability in PCT/US2008/076160, dated Mar. 25, 2010, 6 pages.
Authorized officer Chung Keun Lee, International Search Report and Written Opinion in PCT/US2008/076199, dated Mar. 24, 2009, 11 pages.
Authorized officer Dorothée Mühausen, International Preliminary Report on Patentability in PCT/US2008/076199, dated Apr. 1, 2010, 6 pages.
Authorized officer Keon Hyeong Kim, International Search Report and Written Opinion in PCT/US2008/085031, dated Jun. 24, 2009, 11 pages.
Authorized officer Yolaine Cussac, International Preliminary Report on Patentability in PCT/US2008/085031, dated Jun. 24, 2010, 6 pages.
Authorized officer Tae Hoon Kim, International Search Report and Written Opinion in PCT/US2009/041304, dated Dec. 18, 2009, 13 pages.
Authorized officer Dorothée Mülhausen, International Preliminary Report on Patentability, in PCT/US2009/041304, dated Nov. 4, 2010, 8 pages.
Authorized officer Sung Hee Kim, International Search Report and the Written Opinion in PCT/US2009/057554, dated May 10, 2010, 13 pages.
Authorized Officer Gijsbertus Beijer, International Preliminary Report on Patentability in PCT/US2009/057554, dated Mar. 29, 2011, 7 pages.
Authorized officer Cheon Whan Cho, International Search Report and Written Opinion in PCT/US2009/066647, dated Jul. 1, 2010, 16 pages.
Authorized officer Athina Nikitas-Etienne, International Preliminary Report on Patentability in PCT/US2009/066647, dated Jun. 23, 2011, 12 pages.
Authorized officer Sung Chan Chung, International Search Report and Written Opinion for PCT/US2010/021824, dated Aug. 23, 2010, 9 pages.
Authorized officer Beate Giffo-Schmitt, International Preliminary Report on Patentability in PCT/US2010/021824, dated Aug. 18, 2011, 6 pages.
Authorized officer Sang Ho Lee, International Search Report and Written Opinion in PCT/US2010/034579, dated Dec. 24, 2010, 9 pages.
Authorized officer Nora Lindner, International Preliminary Report on Patentability in PCT/US2010/034579, dated Nov. 24, 2011, 7 pages.
Authorized officer Jeongmin Choi, International Search Report and Written Opinion in PCT/US2010/046193, dated Apr. 26, 2011, 13 pages.
Authorized officer Philippe Bécamel, International Preliminary Report on Patentability in PCT/US2010/046193, dated Mar. 8, 2012, 10 pages.
Authorized officer Sang Ho Lee, International Search Report and Written Opinion in PCT/US2010/059486, dated Jul. 26, 2011, 9 pages.
Authorized officer Nora Lindner, International Preliminary Report on Patentability in PCT/US2010/059486, dated Jun. 21, 2012, 6 pages.
Authorized officer Kwan Sik Sul, International Search Report and Written Opinion in PCT/US2011/063975, dated May 18, 2012, 8 pages.
Authorized officer Simin Baharlou, International Preliminary Report on Patentability in PCT/US2011/063975, dated Jun. 27, 2013, 5 pages.

(56) References Cited

OTHER PUBLICATIONS

Authorized officer Sang-Taek Kim, International Search Report and Written Opinion in PCT/US2011/061407, dated May 22, 2012, 10 pages.
Authorized officer Lingfei Bai, International Preliminary Report on Patentability in PCT/US2011/061407, dated Jun. 6, 2013, 7 pages.
Authorized officer Kwan Sik Sul, International Search Report and Written Opinion in PCT/US2012/023160, dated May 24, 2012, 9 pages.
Authorized officer Simin Baharlou, International Preliminary Report on Patentability in PCT/US2012/023160, dated Aug. 15, 2013, 6 pages.
Authorized officer Jeongmin Choi, International Search Report and Written Opinion in PCT/US2012/027146, dated Sep. 24, 2012, 12 pages.
Authorized officer Athina Nickitas-Etienne, International Preliminary Report on Patentability in PCT/US2012/027146, dated Sep. 19, 2013, 9 pages.
Authorized officer Tae Hoon Kim, International Search Report and Written Opinion in PCT/US2013/035837, dated Jul. 30, 2013, 9 pages.
Authorized officer Agnès Wittmann-Regis, International Preliminary Report on Patentability in PCT/US2013/035837, dated Oct. 23, 2014, 6 pages.
Authorized officer Sang Won Choi, International Search Report and Written Opinion in PCT/US2013/048275, dated Oct. 14, 2013, 17 pages.
Authorized officer Simin Baharlou, International Preliminary Report on Patentability in PCT/US2013/048275, dated Jan. 8, 2015, 14 pages.
Authorized officer Hye Lyun Park, International Search Report and Written Opinion in PCT/US2013/050914, dated Oct. 18, 2013, 11 pages.
Authorized officer Yukari Nakamura, International Preliminary Report on Patentability in PCT/US2013/050914, dated Jan. 29, 2015, 8 pages.
Authorized officer Sang Won Choi, International Search Report and Written Opinion in PCT/US2013/024470, dated May 27, 2013, 12 pages.
Authorized officer Simin Baharlou, International Preliminary Report on Patentability in PCT/US2013/024470, dated Aug. 14, 2014, 9 pages.
Authorized officer June Young Son, International Search Report and Written Opinion in PCT/US2014/016298, dated May 23, 2014, 15 pages.
Authorized officer Kihwan Moon, International Preliminary Report on Patentability in PCT/US2014/016298, dated Aug. 27, 2015, 12 pages.
Authorized officer Tae Hoon Kim, International Search Report and Written Opinion in PCT/US2014/027523, dated Jul. 30, 2014, 14 pages.
Authorized officer Nora Lindner, International Preliminary Report on Patentability in PCT/US2014/027523, dated Sep. 24, 2015, 11 pages.
Authorized officer June Young Son, International Search Report and Written Opinion in PCT/US2014/024191, dated Aug. 7, 2014, 11 pages.
Authorized officer Kihwan Moon, International Preliminary Report on Patentability in PCT/US2014/024191, dated Sep. 24, 2015, 8 pages.
Authorized officer June Young Son, International Search Report and Written Opinion in PCT/US2014/046030, dated Oct. 21, 2014, 12 pages.
Authorized officer Agnès Wittmann-Regis, International Preliminary Report on Patentability in PCT/US2014/046030, dated Jan. 28, 2016, 9 pages.
European Search Report in Application No. 10 81 5813.0, dated Mar. 12, 2013, 9 pages.
Search Report and Action in TW Application No. 098132132, dated Dec. 6, 2012, 8 pages.
Search Report and Action in TW Application No. 098141930, dated Jul. 10, 2014, 7 pages.
Chinese First Office Action for Application No. 200880120050.6, dated Aug. 2, 2011, 10 pages.
Chinese First Office Action for Application No. 200980114639.X, dated May 14, 2012, 13 pages.
Ando et al., "10-W/mm AlGaN—GaN HFET with a Field Modulating Plate," IEEE Electron Device Letters, 2003, 24(5):289-291.
Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.
Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.
Barnett and Shinn, "Plastic and Elastic Properties of Compositionally Modulated Thin Films," Annu. Rev. Mater. Sci., 1994, 24:481-511.
Chen et al., "High-performance AlGaN/GaN Lateral Field-effect Rectifiers Compatible with High Electron Mobility Transistors," Applied Physics Letters, 2008, 92, 253501-1-3.
Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.
Coffie, "Characterizing and Suppressing DC-to-RF Dispersion in AlGaN/GaN High Electron Mobility Transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 2003, 39(19):1419-1420.
Chu et al., "1200-V Normally off GaN-on-Si Field-effect Transistors with Low Dynamic On-Resistance," IEEE Electron Device Letters, 2011, 32(5):632-634.
Dora et al., "High Breakdown Voltage Achieved on AlGaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.
Dora, "Understanding Material and Process Limits for High Breakdown Voltage AlGaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped AlGaN/GaN HEMT's," IEEE Electron Device Letters, 2000, 21(6):268 270.
Gu et al., "AlGaN/GaN MOS Transistors using Crystalline $ZrO_2$ as Gate Dielectric," Proceedings of SPIE, 2007, vol. 6473, 64730S-1-8.
Higashiwaki et al. "AlGaN/GaN Heterostructure Field-Effect Transistors on 4H-SiC Substrates with Current-Gain Cutoff Frequency of 190 GHz," Applied Physics Express, 2008, 021103-1-3.
Hwang et al., "Effects of a Molecular Beam Epitaxy Grown AlN Passivation Layer on AlGaN/GaN Heterojunction Field Effect Transistors," Solid-State Electronics, 2004, 48:363-366.
Im et al., "Normally Off GaN MOSFET Based on AlGaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.
Karmalkar and Mishra, "Very High Voltage AlGaN/GaN High Electron Mobility Transistors Using a Field Plate Deposited on a Stepped Insulator," Solid-State Electronics, 2001, 45:1645-1652.
Keller et al., "GaN—GaN Junctions with Ultrathin AlN Interlayers: Expanding Heterojunction Design," Applied Physics Letters, 2002, 80(23):4387-4389.

(56) References Cited

OTHER PUBLICATIONS

Khan et al., "AlGaN/GaN Metal Oxide Semiconductor Heterostructure Field Effect Transistor," IEEE Electron Device Letters, 2000, 21(2):63-65.
Kim, "Process Development and Device Characteristics of AlGaN/GaN HEMTs for High Frequency Applications," PhD Thesis, University of Illinois at Urbana-Champaign, 2007, 120 pages.
Kumar et al., "High Transconductance Enhancement-mode AlGaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage," Electronic Letters, 2005, 41(7):449-450.
Lee et al., "Self-aligned Process for Emitter- and Base-regrowth GaN HBTs and BJTs," Solid-State Electronics, 2001, 45:243-247.
Marchand et al., "Metalorganic Chemical Vapor Deposition on GaN on Si(111): Stress Control and Application to Filed-effect Transistors," Journal of Applied Physics, 2001, 89(12):7846-7851.
Mishra et al., "AlGaN/GaN HEMTs—An Overview of Device Operation and Applications," Proceedings of the IEEE, 2002, 90(6):1022-1031.
Nanjo et al., "Remarkable Breakdown Voltage Enhancement in AlGaN Channel High Electron Mobility Transistors," Applied Physics Letters 92 (2008), 3 pages.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Oka and Nozawa, "AlGaN/GaN Recessed MIS-gate HFET with High-threshold-voltage Normally-off Operation for Power Electronics Applications," IEEE Electron Device Letters, 2008, 29(7):668-670.
Palacios et al., "AlGaN/GaN HEMTs with an InGaN-based Back-barrier," Device Research Conference Digest, 2005, PRC '05 63rd, pp. 181-182.
Palacios et al., "AlGaN/GaN High Electron Mobility Transistors with InGaN Back-Barriers," IEEE Electron Device Letters, 2006, 27(1):13-15.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of AlGaN/GaN HEMTs," IEEE Electron Device Letters, 2009, 30(4):313-315.
Tracy Frost, "Planar, Low Switching Loss, Gallium Nitride Devices for Power Conversion Applications," SBIR N121-090 (Navy), 2012, 3 pages.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Reiher et al., "Efficient Stress Relief in GaN Heteroepitaxy on Si(111) Using Low-temperature AlN Interlayers," Journal of Crystal Growth, 2003, 248:563-567.
Saito et al., "Recessed-gate Structure Approach Toward Normally off High-voltage AlGaN/GaN HEMT for Power Electronics Applications," IEEE Transactions on Electron Device, 2006, 53(2):356-362.
Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.
Shen, "Advanced Polarization-based Design of AlGaN/GaN HEMTs," Jun. 2004, PhD Thesis, University of California, Santa Barbara, 192 pages.
Sugiura et al., "Enhancement-mode n-channel GaN MOSFETs Fabricated on p-GaN Using $HfO_2$ as Gate Oxide," Electronics Letters, 2007, vol. 43, No. 17, 2 pages.
Suh et al. "High-Breakdown Enhancement-mode AlGaN/GaN HEMTs with Integrated Slant Field-Plate," Electron Devices Meeting, 2006, IEDM '06 International, 3 pages.
Tipirneni et al. "Silicon Dioxide-encapsulated High-Voltage AlGaN/GaN HFETs for Power-Switching Applications," IEEE Electron Device Letters, 2007, 28(9):784-786.
Vetury et al., "Direct Measurement of Gate Depletion in High Breakdown (405V) Al/GaN/GaN Heterostructure Field Effect Transistors," IEDM 98, 1998, pp. 55-58.
Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.
Wang et al., "Enhancement-mode $Si_3N_4$/AlGaN/GaN MISHFETs," IEEE Electron Device Letters, 2006, 27(10):793-795.
Wu, "AlGaN/GaN Microwave Power High-Mobility Transistors," PhD Thesis, University of California, Santa Barbara, Jul. 1997, 134 pages.
Wu et al., "A 97.8% Efficient GaN HEMT Boost Converter with 300-W Output Power at 1 MHz," Electronic Device Letters, 2008, IEEE, 29(8):824-826.
Yoshida, "AlGan/GaN Power FET," Furukawa Review, 2002, 21:7-11.
Zhang, "High Voltage GaN HEMTs with Low On-resistance for Switching Applications," PhD Thesis, University of California, Santa Barbara, Sep. 2002, 166 pages.
Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

* cited by examiner

ENHANCEMENT MODE III-NITRIDE DEVICES HAVING AN $Al_{1-x}Si_xO$ GATE INSULATOR

CROSS-REFERENCE TO RELATED APPLICATIONS

This application claims the benefit under 35 U.S.C. 371 of PCT Patent Application No. PCT/US2017/013509, entitled "ENHANCEMENT MODE III-NITRIDE DEVICES HAVING AN $AL_{1-x}SI_xO$ GATE INSULATOR," filed Jan. 13, 2017, which application claims the benefit under 35 U.S.C. § 119(e) of U.S. Patent Application No. 62/279,578, entitled "ENHANCEMENT MODE III-NITRIDE DEVICES HAVING AN AMORPHOUS $AL_xSI_yO$ GATE INSULATOR," filed Jan. 15, 2016. The disclosure of the foregoing applications are incorporated herein by reference in their entirety for all purposes.

TECHNICAL FIELD

This specification relates to semiconductor electronic devices, specifically III-Nitride (III-N) semiconductor electronic devices that have an amorphous $Al_{1-x}Si_xO$ gate insulator.

BACKGROUND

Most power semiconductor devices, e.g., high-voltage P-I-N diodes, and power transistors, e.g., power metal-oxide-semiconductor field-effect transistors (MOSFETs) and Insulated Gate Bipolar Transistors (IGBTs), have been typically fabricated with silicon (Si) semiconductor materials. Silicon carbide (SiC) power devices have also been used. III-N devices are attractive semiconductor devices to carry large currents and support high voltages, and provide very low on resistance, high voltage operation, and fast switching times.

Some III-N devices, e.g., high electron mobility transistors (HEMTs) and bidirectional switches (also known as four quadrant switches or FQSs), may be depletion-mode (or D-mode) or normally-on devices, e.g., devices with a negative threshold voltage. That is, the devices are in the ON state unless a sufficiently negative voltage is applied to the gate electrode relative to the source or power electrode. In many applications, in particular in power switching circuits, it is desirable to utilize enhancement-mode (or E-mode) or normally off devices, e.g., devices with a positive threshold voltage, as this can simplify the form of the signals applied by a gate-drive circuit to the device and can prevent accidental turn on of the device in case of device or circuit failure. However, reliable fabrication and manufacturing of high-voltage III-N E-mode devices has proven to be very difficult.

SUMMARY

In a first aspect, a transistor includes a III-N channel layer, a III-N barrier layer on the III-N channel layer, a source contact and a drain contact which are electrically coupled to the III-N channel layer, and an insulator layer on the III-N barrier layer. The transistor further includes a gate insulator, where the gate insulator includes an amorphous $Al_{1-x}Si_xO$ layer where $0.2<x<0.8$, and a gate electrode over the gate insulator and positioned between the source and the drain contacts. The gate insulator can further include nitrogen and can be an amorphous $Al_{1-x}Si_xON$ layer.

In a second aspect, a transistor includes a III-N channel layer, a III-N barrier layer on the III-N channel layer, and source contact and a drain contact which are electrically coupled to the III-N channel layer, and an insulator layer on the III-N barrier layer. The transistor further includes a recess in a first portion of the transistor, the recess extending through both the insulator layer and the III-N barrier layer. The transistor further includes a III-N capping layer different from the III-N barrier layer formed in the recess on the III-N channel layer, a gate insulator on the III-N capping layer at least partially in a portion of the recess, the gate insulator on the III-N capping layer at least partially in a portion of the recess. The gate insulator includes an amorphous $Al_{1-x}Si_xO$ layer where $0.2<x<0.8$. The gate insulator can further include nitrogen and can be an amorphous $Al_{1-x}Si_xON$ layer. The transistor further includes a gate electrode deposited over the gate and at least partially in the recess, where the gate electrode is positioned between the source contact and the drain contact.

In a third aspect, a method of fabricating a III-N device includes a material structure including a III-N barrier layer on a III-N channel layer, an insulator layer on the III-N barrier layer, and forming a recess in a first portion of the device. Forming the recess includes removing the insulator layer and the III-N channel layer in the first portion of the device to expose the III-N channel layer in the first portion of the device. Forming the III-N device can further include forming an amorphous $Al_{1-x}Si_xO$ layer at least partially in the recess, wherein the $Al_{1-x}Si_xO$ layer is formed over the channel layer in the first portion of the device, and forming a gate electrode on the $Al_{1-x}Si_xO$ layer at least partially in the recess, where the gate electrode includes a compound semiconductor material. Forming the $Al_{1-x}Si_xO$ layer can include using source gases that contain nitrogen and incorporating the nitrogen into the $Al_{1-x}Si_xO$ forming an amorphous $Al_{1-x}Si_xON$ layer.

In a fourth aspect, a method of fabricating a III-N device includes a material structure including a III-N barrier layer on a III-N channel layer, an insulator layer on the III-N barrier layer, and forming a recess in a first portion of the device. Forming the recess includes removing the insulator layer and the III-N channel layer in the first portion of the device to expose the III-N channel layer in the first portion of the device. Forming the III-N device can further include forming a III-N capping layer in the recess on the first portion of the device over the III-N channel layer, forming an amorphous $Al_{1-x}Si_xO$ at least partially in the recess over the III-N capping layer in the first portion of the device. Annealing the III-N device in a gas ambient including oxygen at an elevated temperature, and forming a gate electrode on the $Al_{1-x}Si_xO$ layer at least partially in the recess, wherein the gate electrode includes a compound semiconductor material.

The foregoing and other embodiments can each optionally include one or more of the following features, alone or in combination. A portion of the recess or trench that is through the barrier layer can include vertical or slanted sidewalls, and a portion of the recess or trench that is through the insulator layer can include slanted sidewalls. Forming the recess can include exposing the top surface of the channel layer in the first portion of the device. Removing the insulator layer and the part of the barrier layer in the first portion of the device can include dry etching the insulator layer and the barrier layer in the first portion of the device. Removing the insulator layer and the part of the barrier layer in the first portion of the device can include removing the insulator layer in the first portion of the device by dry etching in a first gas ambient to expose a second top surface of the barrier layer, as well as removing the part of the barrier layer in the first portion of the device by dry etching in a second gas ambient which is different from the first gas ambient. The insulator layer can include a silicon nitride layer and the barrier layer can include an aluminum gallium nitride ($Al_xGa_{1-x}N$) layer, where the first gas ambient can include $SF_6$ and the second gas ambient includes $Cl_2$.

Forming an insulator layer can include forming a first silicon nitride layer by metal organic chemical vapor deposition (MOCVD) as the insulator layer. Fabricating the III-N device can also include forming a gate insulator at least partially in the recess, where the gate insulator is formed on the top surface of the channel layer in the first portion of the device. Forming the gate insulator can include depositing an amorphous aluminum silicon oxide ($Al_{1-x}Si_xO$) layer in the recess. A thickness of the amorphous $Al_{1-x}Si_xO$ layer can be between 1 nm and 100 nm. A ratio of the silicon fractional composition to the Al fractional composition (1−x)/x in the $Al_{1-x}Si_xO$ layer can be 0.2<x<0.8. Depositing the amorphous $Al_{1-x}Si_xO$ layer can include forming the amorphous $Al_{1-x}Si_xO$ layer at a growth or deposition temperature higher than 500° C. Fabricating the III-N device can include forming source and drain contacts electrically coupled to the channel layer, and forming a gate electrode on the gate insulator at least partially in the recess between the source and drain contacts. Forming the gate insulator layer can include using a gas ambient that includes nitrogen, and forming an amorphous $Al_{1-x}Si_xON$ layer. Forming the III-N barrier layer can include forming the III-N barrier layer with a higher bandgap than the channel layer, such that a conductive channel is induced in the channel layer, and forming the source and drain contacts can include forming respective ohmic contacts for the source and drain contacts that are electrically coupled to the conductive channel.

Fabricating a device can also include forming an electrode in the recess. A second insulator layer can be formed prior to forming the electrode, where the second insulator layer is between the electrode and the top surface of the first III-N layer in the recess. The electrode can be a gate electrode, a conductive channel can be induced adjacent to an interface between the first and second III-N layers due to a compositional difference between the first and second III-N layers, and fabricating a device can further include forming a source and drain electrode, the source and drain electrodes being on opposite sides of the gate electrode and being electrically coupled to the conductive channel. The conductive channel can be largely depleted of mobile charge below the recess when 0V is applied to the gate electrode relative to the source electrode, but becomes populated with mobile charge when a sufficiently positive voltage is applied to the gate electrode relative to the source electrode. The electrode can include an extending portion which extends over the insulator layer towards the drain electrode. The second insulator layer can include an extending portion that is between the extending portion of the electrode and the insulator layer. Fabricating a device can also include partially removing the second III-N layer in the first portion of the device after the removing of the insulator layer in the first portion of the device but prior to the annealing of the device, causing a remaining portion of the second III-N layer in the first portion of the device to have a first thickness which is less than a second thickness of portions of the second III-N layer that are on opposite sides of the recess. The first thickness can be between 3 nm and 10 nm.

In the III-N device, the first sidewalls of the recess can be vertical or slanted and the second sidewalls of the recess can be slanted. The gate electrode can include extending portions that are outside the recess and extend towards but are separated from the source and drain contacts, respectively. The barrier layer can have a larger bandgap than the channel layer, such that a conductive channel is induced in the channel layer. The source and drain contacts can form respective ohmic contacts that are electrically coupled to the conductive channel. The conductive channel can be discontinuous in a region of the channel layer beneath the recess when 0V is applied to the gate electrode relative to the source contact, but is continuous when a voltage greater than a threshold voltage of the device is applied to the gate electrode relative to the source contact, the threshold voltage being greater than 0V. The III-N device can function as an enhancement-mode field effect transistor having the threshold voltage of more than 2V and a threshold voltage hysteresis of less than 0.5V. The gate insulator can include an amorphous $Al_{1-x}Si_xO$ layer. A thickness of the amorphous $Al_{1-x}Si_xO$ layer can be between 1 nm and 100 nm. The III-N channel layer can include a III-N layer without Aluminum (Al) and the III-N barrier layer can include an Al-based III-N layer. The threshold voltage hysteresis is defined as the change in the voltage when sweeping from negative gate bias voltage to a positive gate bias voltage greater than the turn on voltage compared to the threshold voltage when sweeping from a positive gate bias voltage to a negative gate bias voltage to a bias voltage less than the turn on voltage of the device.

As used herein, the terms III-Nitride or III-N materials, layers, devices, etc., refer to a material or device included of a compound semiconductor material according to the stoichiometric formula $B_wAl_xIn_yGa_zN$, where w+x+y+z is about 1 with 0≤w≤1, 0≤x≤1, 0≤y≤1, and 0≤z≤1. III-N materials, layers, or devices, can be formed or prepared by either directly growing on a suitable substrate (e.g., by metal organic chemical vapor deposition), or growing on a suitable substrate, detaching from the original substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications, especially power switching applications.

As used herein, a "high-voltage device", e.g., a high-voltage switching transistor, HEMT, bidirectional switch, or four-quadrant switch (FQS), is an electronic device which is optimized for high-voltage applications. That is, when the device is off, it is capable of blocking high voltages, such as about 300V or higher, about 600V or higher, or about 1200V or higher, and when the device is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, 2500V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, 1700V, 2500V, or other suitable blocking voltage required by the application.

As used herein, a "III-N device" is a device based on III-N heterostructures. The III-N device can be designed to operate as an E-mode transistor or switch. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, 2500V, or higher. When the high voltage device is biased on (e.g., the voltage on the gate relative to the source or associated power terminal is greater than the device threshold voltage), it is able to conduct substantial current with a low on-voltage (i.e., a low voltage between the source and drain terminals or between opposite power terminals). The maximum allowable on-voltage is the maximum on-state voltage that can be sustained in the application in which the device is used.

The details of one or more disclosed implementations of the subject matter described in this specification are set forth in the accompanying drawings and the description below. Additional features and variations may be included in the implementations as well. Other features, aspects, and advantages will become apparent from the description, the drawings and the claims.

DESCRIPTION OF DRAWINGS

Like reference numbers and designations in the various drawings indicate like elements.

DETAILED DESCRIPTION

Described herein are enhancement-mode III-N devices, and methods for forming the devices. The devices include a III-N heterostructure with a two-dimensional electron gas (2DEG) channel therein. A recess is formed in the III-N material structure in a gate region of the device. An amorphous $Al_{1-x}Si_xO$ gate insulator layer is formed in the recess, and a gate electrode is formed on the gate insulator layer. As described in detail below, the amorphous $Al_{1-x}Si_xO$ gate insulator layer allows for higher threshold voltages with less hysteresis and substantially improved reliability as compared to other enhancement-mode III-N transistors which utilize a gate insulator.

Figure 1:
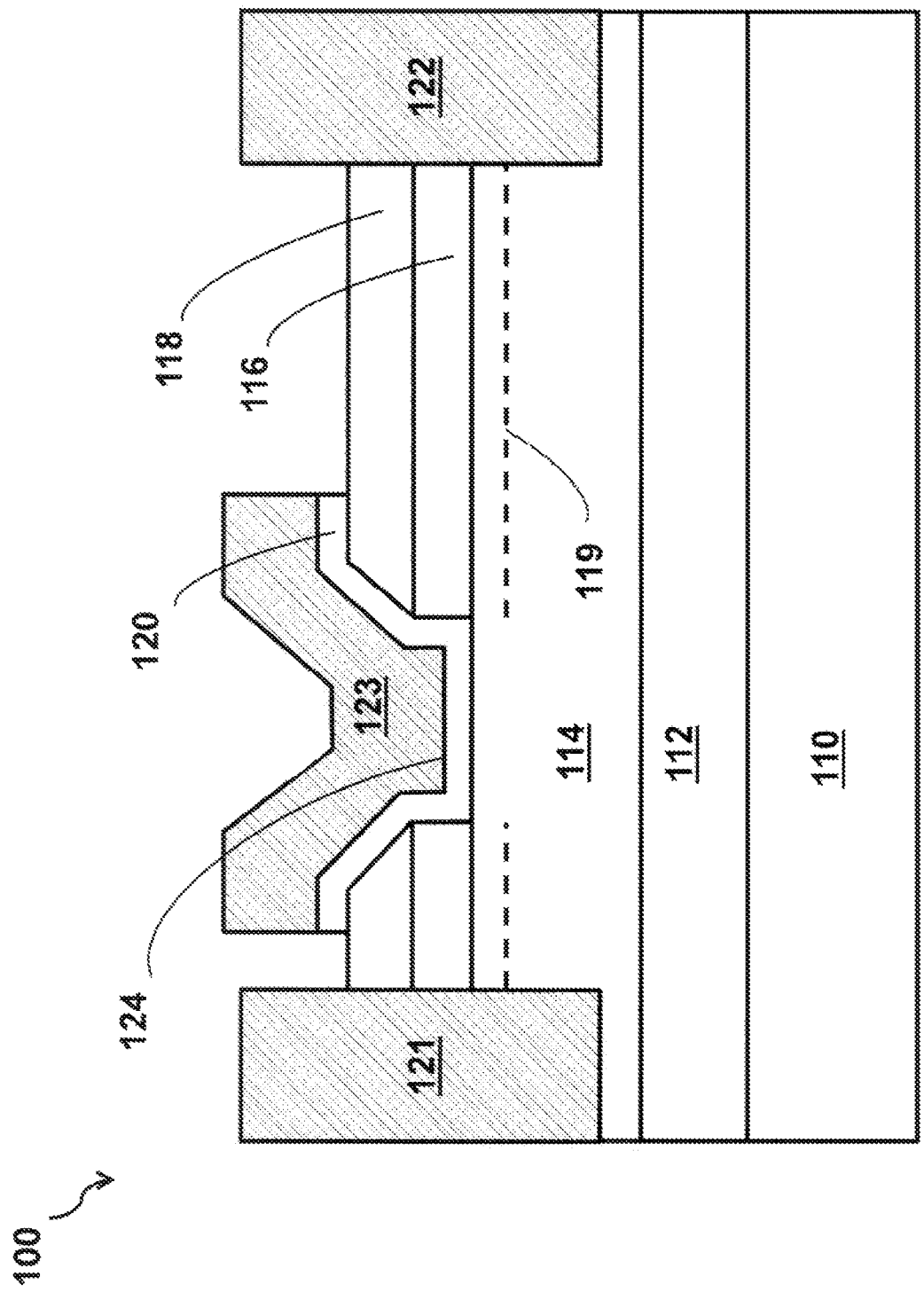
FIG. 1 is a cross-sectional view of an example of a III-N device.

FIG. 1 is a cross sectional view of an example III-N device 100. The III-N device 100 can be a III-N transistor or switch, and in particular a high-voltage III-N enhancement-mode field effect transistor.

The III-N device 100 includes a substrate layer 110. The substrate layer 110 can be a substrate made of, for example, Silicon (Si), Silicon Carbide (SiC), Sapphire ($Al_2O_3$), Aluminum Nitride (AlN), Gallium Nitride (GaN), or any other suitable substrate upon which III-N materials can be formed.

A buffer layer 112 is formed on the substrate layer 110. The buffer layer 112 can be a III-N buffer layer, e.g., a GaN layer, an $Al_xGa_{1-x}N$ layer, or the like. The buffer layer 112 can be rendered insulating or substantially free of n-type mobile carriers, e.g., by including dislocations or point defects in the buffer layer 112, and/or by doping the buffer layer 112 with compensating elements, e.g., Iron (Fe), Carbon (C), and/or Magnesium (Mg). The buffer layer 112 can have a substantially uniform composition throughout the layer. In some implementations, one or more compositions vary throughout the buffer layer 112. For example, the buffer layer 112 can be graded, e.g., by grading an Al composition in the buffer layer 112. In some cases, the buffer layer 112 is substantially thicker than any of the other III-N layers in the III-N device 100.

The III-N device 100 includes a channel layer 114 formed on the buffer layer 112. The channel layer 114 can be a III-N layer, e.g., an undoped GaN layer or a slightly or unintentionally doped GaN layer. In some examples, the channel layer 114 is a III-N layer without Al composition, for example GaN or $In_zGa_{1-z}N$.

A barrier layer 116 is formed on the channel layer 114. The barrier layer 116 and the channel layer 114 can have different compositions or III-N materials from one another. The compositions or III-N materials are selected such that the barrier layer 116 can have a larger bandgap than the channel layer 114. In some examples, the barrier layer 116 is an Al-based III-N layer, e.g., an $Al_xGa_{1-x}N$ layer, an $Al_yIn_{1-y}N$ layer, or an AlInGaN layer. The barrier layer can be an undoped GaN layer. The barrier layer 116 can be n-doped or can contain no significant concentration of doping impurities. In the case that the barrier layer 116 is undoped, polarization fields can exist between the channel layer 114 and the barrier layer 116, such that a fixed charge is induced at or adjacent to the interface between layers 114 and 116.

The energy band edge discontinuity in the conduction band of the III-N material structure, resulting from the bandgap difference and/or the difference in electron affinity between layers 114 and 116, in combination with the doping of the barrier layer 116 or introduced polarization, can induce a conductive channel 119 in the channel layer 114, e.g., near an interface between the channel layer 114 and the barrier layer 116, as illustrated in FIG. 1. The conductive channel 119 can include a 2-dimensional electron gas (2DEG) channel, e.g., between source contact 121 and gate contact 123, as well as between gate contact 123 and drain contact 122. As shown in FIG. 1, when the device 100 is in the OFF state (i.e., the gate contact 123 is biased relative to the source contact 121 at a voltage lower than the device threshold voltage), the conductive channel 119 is depleted of mobile charge below the gate electrode 123, and so the 2DEG is discontinuous between the source contact 121 and the drain contact 122. When the device 100 is in the ON state (i.e., the gate contact 123 is biased relative to the source contact 121 at a voltage higher than the device threshold voltage), the conductive channel 119 below the gate electrode 123 is populated with mobile charge (not shown in FIG. 1), and the 2DEG is continuous from the source all the way to the drain. In some implementations, the source and drain contacts 121 and 122, respectively, form ohmic contacts electrically coupled to, electrically connected to, or contacting the 2DEG channel. The gate contact 123 can modulate a portion of the 2DEG channel in a gate region, e.g., directly beneath the gate contact 123.

The III-N device 100 can also include an insulator layer 118. The insulator layer 118 can be a passivation layer, preventing or suppressing dispersion by preventing or suppressing voltage fluctuations at the uppermost III-N surface. The insulator layer 118 can be made of $Si_xN_y$, $Al_2O_3$, $SiO_2$, $Al_xSi_yN$, $Al_xSi_yO$, $Al_xSi_yON$ or the like, and can be formed by metal organic chemical vapor deposition (MOCVD), low pressure chemical vapor deposition (LPCVD), plasma enhanced chemical vapor deposition (PECVD), chemical vapor deposition (CVD), sputtering, atomic layer deposition (ALD), high density chemical vapor deposition, or any suitable deposition process. In a particular example, the insulator layer 118 is a Silicon Nitride ($Si_xN_y$) layer formed by MOCVD.

The source contact 121, e.g., a source electrode, and the drain contact 122, e.g., a drain electrode, can be formed by metal stacks in contact with one of the III-N layers, e.g., the channel layer 114 or the barrier layer 116. A recess can be formed in the III-N layers to allow for improved contact of the metal stacks to the 2-DEG channel. The metal stacks can be Ti/Al/Ni/Au, Ti/Al, or the like. The source contact 121 and the drain contact 122 can be formed by metal evaporation and post-deposition annealing processes. Other ohmic contact processes can also be used including sputtering and dry etch processing.

To shape the electric field in a high-voltage-field region of the III-N device 100, a recess or trench 124 is formed to reduce a peak electric field and increase a device breakdown voltage as well as the device threshold voltage, thereby allowing for high voltage operation. The recess 124 can also cause the device 100 to operate in enhancement mode (i.e., to be an E-mode device). The recess 124 can be formed by removing all of the insulator layer 118 and part or all of the barrier layer 116 in a trench shape. Part of the channel layer 114 may also be removed during the forming of the recess 124. The residual damage in the channel layer, as well as the depth and shape of the recess, permit achieving enhancement mode operation along with a low device on-resistance $R_{on}$, as further described below.

In some implementations, dry etching techniques, e.g., plasma etching, digital plasma etching, or reactive ion etching (RIE), are used to form a recess structure. The dry etching techniques can cause ion bombardment damage, which can reduce the channel carrier mobility. These techniques also have low etching selectivity with respect to III-Nitride materials. That is, it is difficult to selectively etch one composition of III-Nitride materials without substantially etching a different composition of III-Nitride materials using these techniques. Furthermore, it can be difficult to recover a surface with ion bombardment damage. Etching selectivity can also be important for III-N epitaxy layers, as each layer grown epitaxially on a substrate has thickness and composition variations from a center of a wafer to an edge of the wafer. In some cases, the dry etching techniques have little etching selectivity between a barrier layer and a channel layer. Thus, large threshold voltage variations can be caused by different etching depths.

To realize an enhancement-mode transistor using a III-N device structure, it can be important to control etching depth in the recess. A device having the III-N material structure of device 100 but lacking the recess 124 typically operates in depletion mode (i.e., negative device threshold voltage). Including a recess 124 in the III-N material structure in the gate region of the device causes the device threshold voltage to shift to a more positive value. If the etching depth is not deep enough, such that the shift in threshold voltage is small, the III-N device may still remain a depletion mode device, exhibiting normally-on characteristics. If the etching depth is too deep and extends into the channel layer, current communications between the conductive channel underneath gate contact and conductive channels in the device access regions (i.e., the regions between the source and gate and between the gate and drain) can be cut off, even when the device is biased in the ON state. In this case, the III-N device may have a low current density or may not be operational in the ON state, even though normally-off E-mode operation can be realized. Although dry etching rates can be calibrated to reasonable accuracy, variations in barrier layer thickness between different wafers due to growth condition fluctuations of III-N epitaxial layers, as well as variations across a single wafer, may cause low manufacturing yield.

Recess etch cross-sections are typically either rectangular or trapezoidal, i.e., recesses either have vertical sidewalls or sloping sidewalls, but not both. In a device such as device 100, having vertical sidewalls throughout the recess is not desirable, since conformal deposition of defect-free gate dielectric and gate metal can be challenging in III-N device structures having recesses with vertically shaped sidewalls.

As indicated in FIG. 1, the recess 124 can have vertical sidewalls in the barrier layer 116 and slanted sidewalls in the insulator layer 118. The recess 124 can also have slanted sidewalls in the barrier layer 116 (not shown). A top surface of the channel layer 114 is exposed in the recess 124. The recess 124 extends from the top surface of the channel layer 114 through the barrier layer 116 and the insulator layer 118 to a top surface of the insulator layer 118.

A gate insulator 120, e.g., a gate insulator layer or a gate dielectric layer, is grown or deposited conformally at least partially in the recess 124. The gate insulator 120 can be on the top surface of the channel layer 114. The gate insulator 120 can extend at least from the top surface of the channel layer 114 to the top surface of the insulator layer 118. The gate insulator 120 can have a similar profile as the recess sidewalls in the barrier layer 116 and the insulator layer 118.

The gate insulator 120 can, for example, be formed of or include Aluminum Oxide ($Al_2O_3$), Silicon Dioxide ($SiO_2$), $Si_xN_y$, $Al_{1-x}Si_xON$, or any other wide bandgap insulator. In some examples, the gate insulator 120 is an $Al_{1-x}Si_xO$ layer, e.g., an amorphous $Al_{1-x}Si_xO$ layer or a polycrystalline $Al_{1-x}Si_xO$ layer, where x and (1−x) represent the relative fractional compositions of non-oxygen elements in the $Al_{1-x}Si_xO$ layer. That is, (1−x) is the percent of non-oxygen elements in the $Al_{1-x}Si_xO$ layer that are constituted by aluminum, x is the percent of non-oxygen elements in the $Al_{1-x}Si_xO$ layer that are constituted by silicon, and (1−x)/x is the ratio of aluminum to silicon in the $Al_{1-x}Si_xO$ layer. In a particular example, as discussed in further detail below, the gate insulator 120 includes an amorphous $Al_{1-x}Si_xO$ layer that provides high threshold voltage and low gate leakage. In some implementations, an $Al_{1-x}Si_xO$ layer also includes a low concentration of nitrogen. That is, during the formation of $Al_{1-x}Si_xO$ layers, a low concentration of nitrogen can be incorporated into the layer, where the nitrogen concentration is substantially lower than the concentrations of Al, Si, and O in the layer. An $Al_{1-x}Si_xO$ gate insulator layer can have improved enhancement mode device characteristics compared to other gate insulator layers, for example SiN, $Al_2O_3$, $SiO_2$, or $Al_{1-x}Si_xN$. These and other advantages will be described in detail below. The amorphous $Al_{1-x}Si_xO$ layer can have a thickness of between about 1 nm and 100 nm, for example between 1 nm and 60 nm. A post-deposition oxygen anneal can be performed on the gate insulator 120. The anneal process can be performed in a MOCVD growth reactor. The anneal process can be performed without exposure to air between the gate insulator deposition in a MOCVD growth reactor. The temperature of the anneal can be greater than 800° C. The time of the anneal can be for 10 min, or 20 min, or more.

In some implementations, the gate insulator 120 is a ternary compound such as an $Al_{1-x}A_xO$ layer, where A is an element from the fourth group of the periodic table, e.g., an amorphous $Al_{1-x}Si_xO$ layer or a polycrystalline $Al_{1-x}Si_xO$ layer. Gate insulator 120 could be a wideband gap quaternary insulator such as $Al_{1-x}Si_xON$. The gate insulator 120 could also be a wideband gap quaternary insulator such as $Al_xM_yA_zO$, where M is a transition metal element, A is an element of the fourth group of the periodic table, and x, y, and z are the relative fractional compositions of non-oxygen elements in the $Al_xM_yA_zO$ layer. The quaternary insulator reduces to the ternary when either y or z is equal to zero. Although amorphous layers may be preferable, other mixed phase matrices could also be used.

Next, the gate contact 123, e.g., a gate electrode, is formed conformally on the gate insulator 120 at least partially in the recess 124. Similarly to the gate insulator 120, the portion of the gate contact 123 that is in the recess and adjacent to the barrier layer 116 can be oriented vertically, and the portion of the gate contact 123 that is in the recess and adjacent to the insulator layer 118 can be slanted. In some implementations, the gate contact 123 includes extending portions that are outside the recess 124 and extend towards the source contact 121 and/or the drain contact 122, respectively. The extending portions are separated from the source contact 121 and the drain contact 122, respectively. The extending portions of the gate contact 123 can function as field plates for the III-N device 100. In some examples, the extending portions of the gate contact at least partially include the slanted portions of the gate contact and can function as slant field plates, which may improve device performance.

The gate contact 123 can be formed as metal stacks, e.g., titanium/aluminum (Ti/Al) or nickel/gold (Ni/Au), and can be deposited by metal evaporation or sputtering or chemical vapor deposition. The gate contact 123 may alternatively be another conductive material or material stack including one or more materials having a large work function, such as a semiconductor material having a large work function (e.g., p-type poly-silicon, indium tin oxide, tungsten nitride, indium nitride, or titanium nitride). A post-gate deposition annealing process may optionally be performed after deposition of the gate contact 123. The post-gate deposition anneal may be performed in a gas ambient including oxygen or a forming gas ($H_2+N_2$). The post gate deposition anneal temperature can be greater than 300° C., or greater than 400° C. Finally, the gate contact 123 can be used as an etch mask to etch the gate insulator 120, such that the gate insulator 120 remains directly beneath the gate contact 123 but is etched away, or partially etched away (not shown), everywhere else.

As illustrated in FIG. 1, when 0V (or any voltage less than the device threshold voltage) is applied to the gate contact 123 relative to the source contact 121, the conductive channel 119 is discontinuous in a region of the channel layer 114 directly beneath the recess 124 in the gate region of the III-N device 100. As a consequence of the discontinuity of the conductive channel 119, the device channel between the source and drain contacts is not conductive when 0 V is applied to the gate contact 123 relative to the source contact 121, but is readily conductive when a sufficiently positive voltage, e.g., above a device threshold voltage, is applied to the gate contact 123 relative to the source contact 121. Thus, the III-N device 100 can function as a high-voltage enhancement-mode device for high voltage applications. The III-N device 100 can be a transistor, a bidirectional switch or four quadrant switch (FQS), and/or any suitable semiconductor device.

FIGS. 2A-2B and FIGS. 3A-3B show example processes 200A-200B and 300A-300B for forming a III-N device. The processes 200A-200B and 300A-300B can be utilized to form the III-N device 100, 400, 500 and 600 of FIG. 1, FIG. 4, FIG. 5 and FIG. 6 respectively.

Figure 2A:
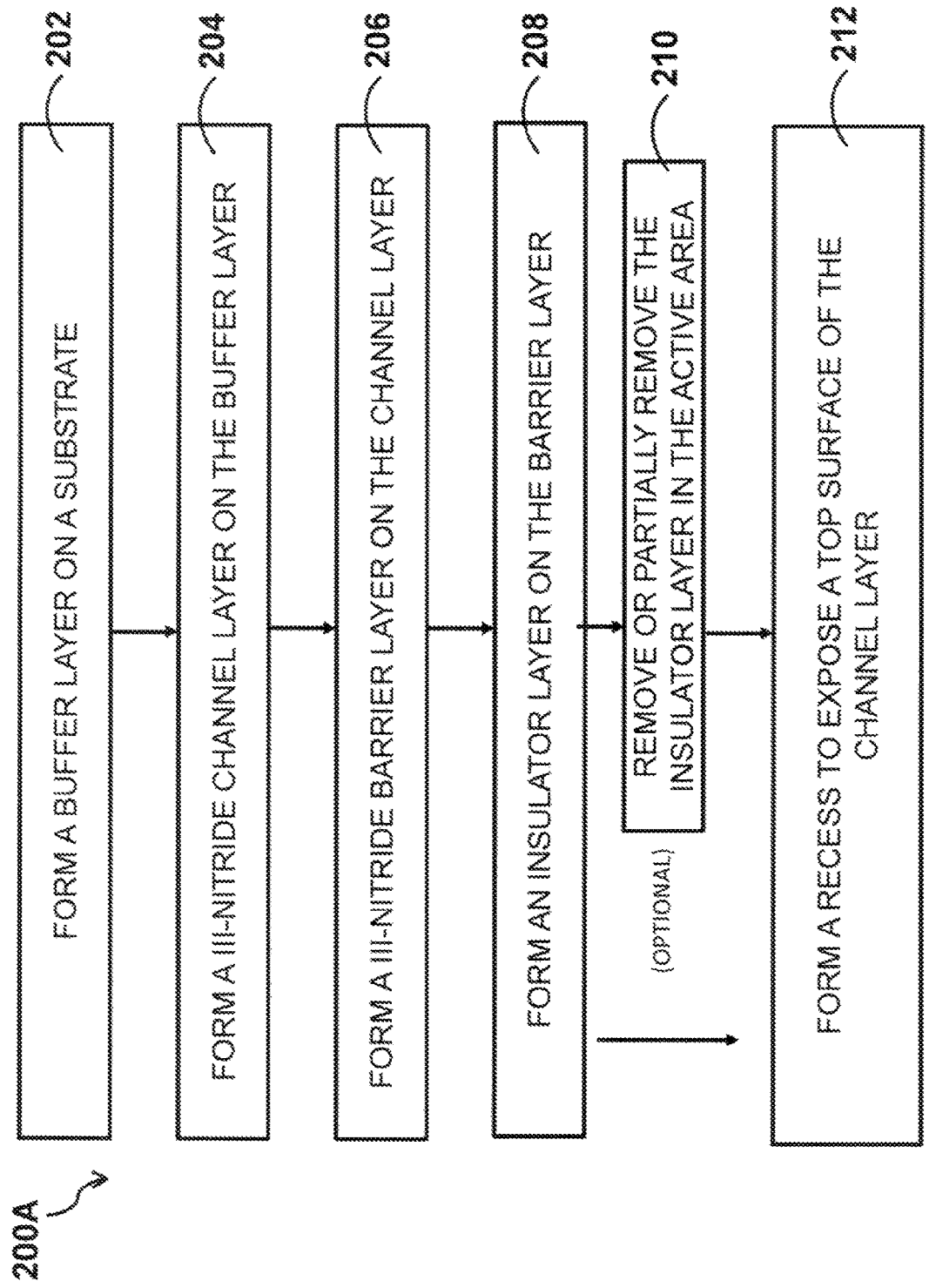
FIGS. 2A-2B are flow diagrams of an example of a partial process for forming a III-N device.

Referring to FIG. 2A, the process 200A includes forming a buffer layer on a substrate (202). The buffer layer and the substrate can be the buffer layer 112 and the substrate layer 110 of FIG. 1, respectively. The substrate can be a silicon wafer. The buffer layer can be formed by either directly growing the buffer layer on the substrate, or alternatively by growing the buffer layer on a first substrate, detaching the buffer layer from the first substrate, and bonding the buffer layer to the substrate. As noted above, forming the buffer layer (step 202) can also include doping the buffer layer with compensating elements.

Next, a III-N channel layer is formed on the buffer layer (step 204). The III-N channel layer can be the channel layer 114 of FIG. 1. The III-N channel layer can be an undoped III-N layer, e.g., an undoped GaN layer. In a particular example, the III-N channel layer is an undoped GaN layer and is substantially free of Al.

A III-N barrier layer is then formed on the channel layer (step 206). The III-N barrier layer can be the barrier layer 116 of FIG. 1. The III-N barrier layer includes different composition or III-N materials from the channel layer, such that the barrier layer has a larger bandgap than the channel layer and a conductive channel, e.g., a 2DEG channel, can be induced in the channel layer. In some examples, the barrier layer is an $Al_xGa_{1-x}N$ layer. The barrier layer can have a thickness of about 30 nm. In a particular implementation, the III-N barrier layer is an $Al_xIn_yGa_{1-x-y}N$ layer, where x and y are the respective aluminum and indium fractional compositions, x+y is the gallium fractional composition, 0<x≤1, 0≤y<1, and 0≤x+y<1. In another embodiment, the III-N barrier layer can have an initial composition of $Al_xGa_{1-x}N$ and a final composition of GaN and is substantially free of Al at the top surface of the III-N barrier layer.

Next, an insulator layer is formed on the barrier layer (step 208). The insulator layer can be the insulator layer 118 of FIG. 1. As noted above, the insulator layer can be made of $Si_xN_y$, $Al_2O_3$, $SiO_2$, $Al_xSi_yN$, $Al_xSi_yO$, $Al_xSi_yON$ or the like, and can be deposited by MOCVD, LPCVD, PECVD, CVD, HDPCVD, sputtering, activated reactive sputtering, ALD, plasma assisted ALD, or any suitable deposition process. In a particular example, the insulator layer is a $SiN_x$ layer formed by MOCVD.

Process 200A, as shown in FIG. 2A can have an optional step (210) to completely remove or partially remove the insulator layer in the active area of the device. The active area of the device is the area between the source contact 121 and the drain contact 122 as shown in FIG. 1. Partially removing the insulator layer can include exposing the top surface of the III-N barrier layer in a first region of the device which is 2 times greater or up to 50 times greater than the width of the recess 124 of FIG. 1. Partially removing the insulator layer (118) can define region 126, shown in FIG. 5.

A recess is then formed to expose a top surface of the channel layer (step 212). The recess can be the recess 124 of FIG. 1. Formation of the recess can include using a wet etching technique or a dry etching technique or a combination of dry and wet etching techniques. The formed recess can have vertical or slanted sidewalls in the barrier layer 116 and slanted sidewalls in the insulator layer 118. The barrier layer can be removed in the recess region and the top surface of the channel layer 114 can be exposed in the recess. In some implementations, the recess 124 can extend into the channel layer 114. For example, the recess 124 can extend less than 10 nm into the channel layer 114. The recess 124 can extend from the top surface of the channel layer 114 through the barrier layer 116 and the insulator layer 118 to a top surface of the insulator layer. In some examples, the conductive channel is discontinuous in a region of the channel layer directly beneath the recess when no voltages are applied to any of the device electrodes (e.g., the source, the gate, or the drain).

Figure 2B:
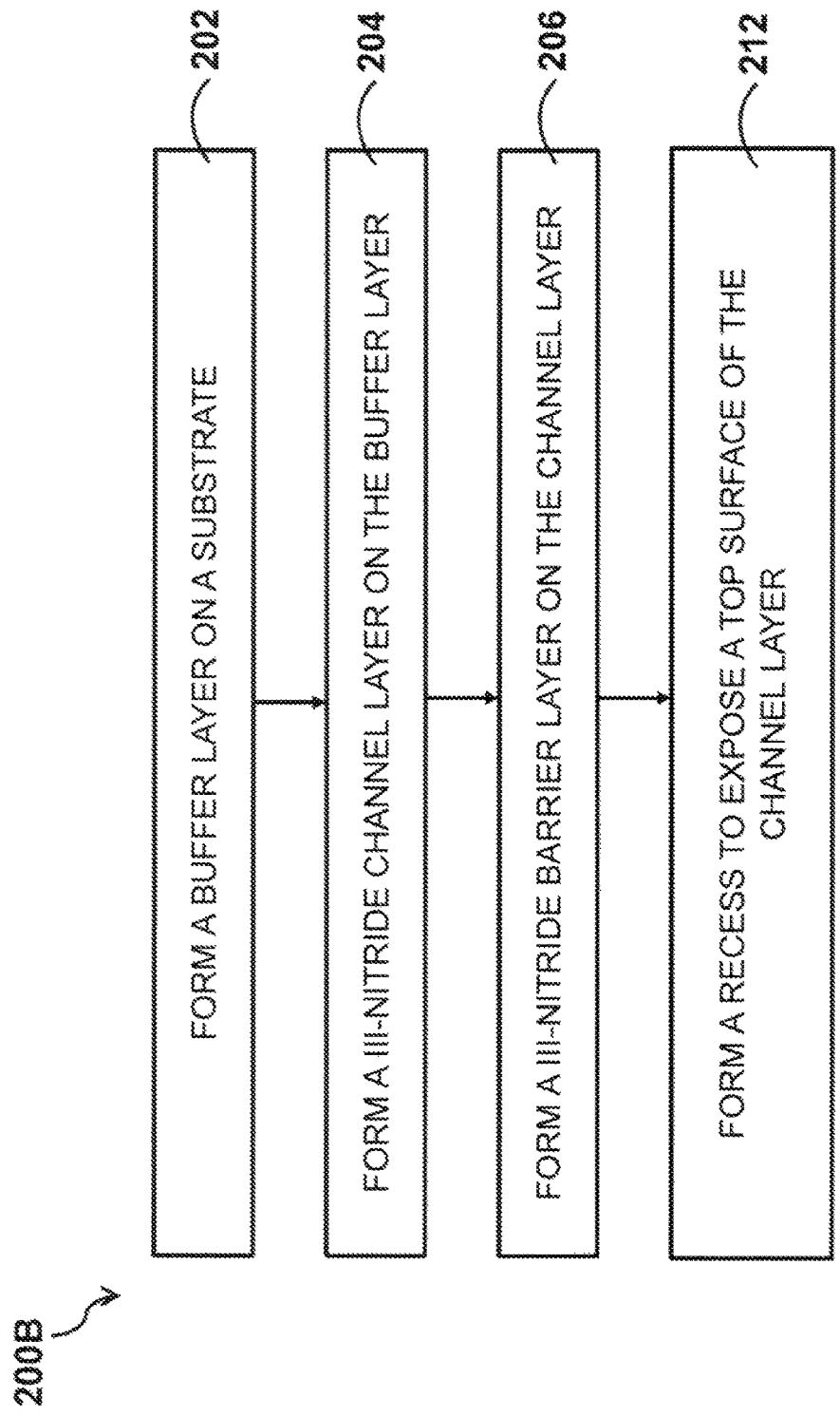
Figure 6:
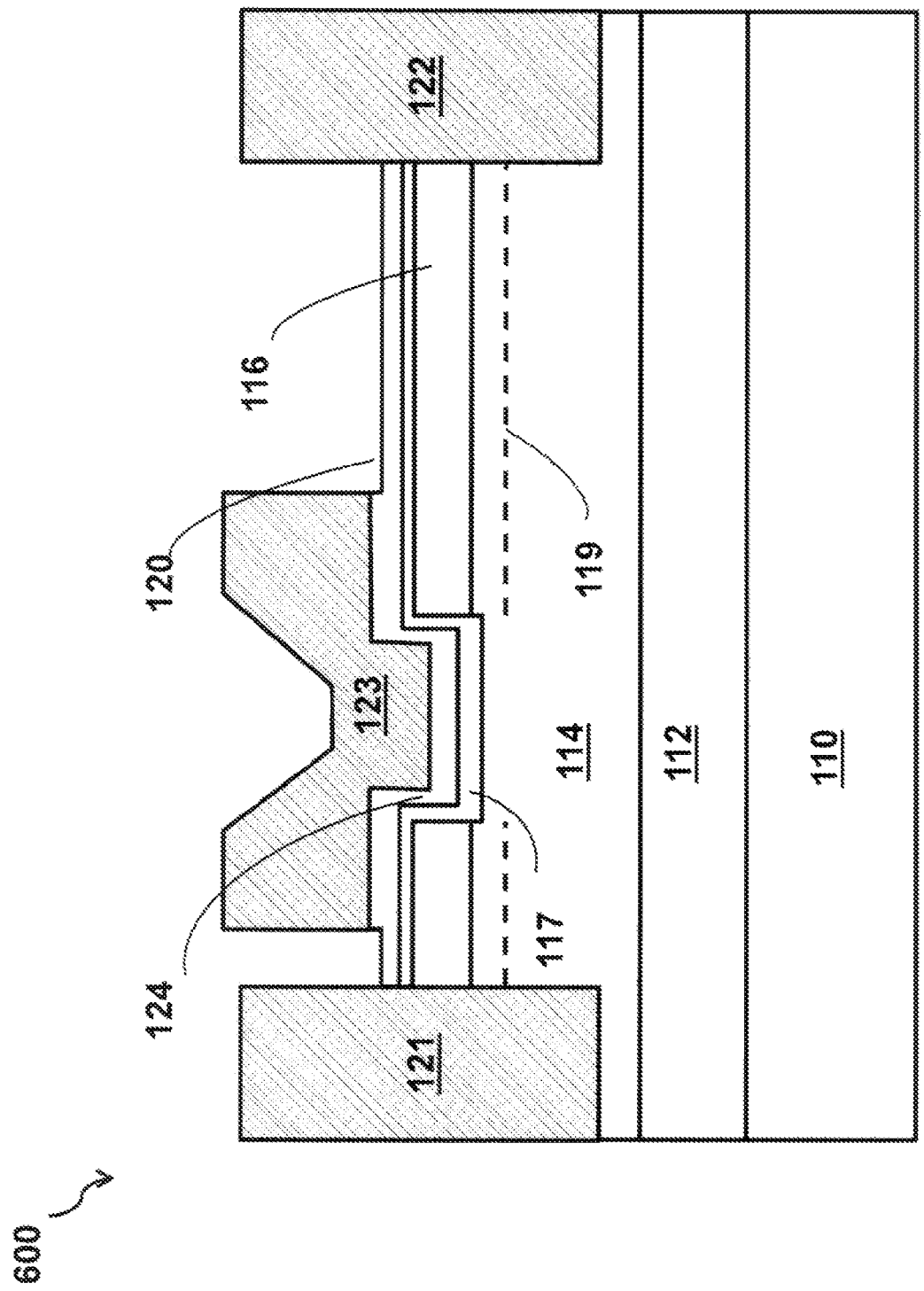
FIG. 6 is a cross-sectional view of another example of a III-N device.

Referring now to FIG. 2B, process 200B can be performed as an alternative to process 200A. Process 200B can include the same process steps as process 200A, but without performing the process step of forming the insulating layer 208 after forming the barrier layer of process steps 206 and before forming the trench of process step 212. In some implementations of process 200B, forming the III-N barrier layer (206) includes forming an initial composition of $Al_xGa_{1-x}N$ and a final composition of GaN. The final composition of GaN can act as a GaN cap to prevent oxidation of the III-N barrier layer and to suppress the formation of surface traps as a result of not forming the insulating layer 208 over the III-N barrier layer 206. An example device 600 formed using process 200B is illustrated in FIG. 6 and is described in further detail below.

Figure 3A:
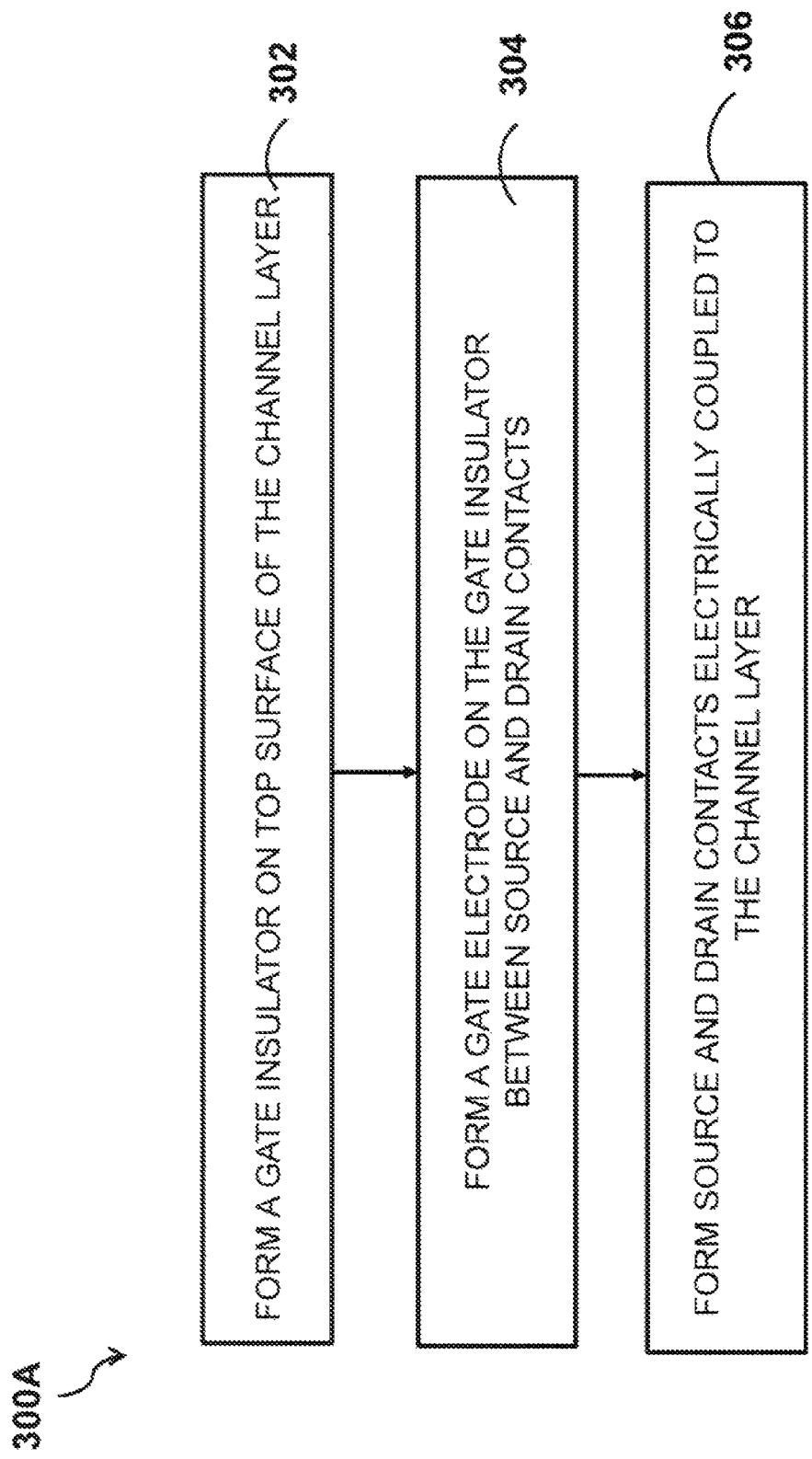
FIG. 3A-3B are flow diagrams of an example of a partial process for forming a III-N device.

Referring now to FIG. 3A, process 300A is described below. Process 300A can be performed after process 200A and can be used to form the device 100 of FIG. 1. A gate insulator is formed on the top surface of the channel layer (step 302). The gate insulator can be the gate insulator 120 of FIG. 1. The gate insulator is formed conformally at least partially in the recess 124. The gate insulator can be in direct contact with the top surface of the channel layer 114 without barrier material there-between. The portion of the gate insulator contacting the barrier layer 116 can have the same profile as the recess in the barrier layer, and the portion of the gate insulator contacting the insulator layer can have the same profile as the recess in the insulator layer.

In some implementations, to achieve high gate bias and low gate leakage, an amorphous aluminum silicon oxide (e.g., $Al_{1-x}Si_xO$ which may optionally include a low concentration of nitrogen) layer is grown as the gate insulator. The III-N device with the amorphous $Al_{1-x}Si_xO$ layer as the gate insulator can achieve a high breakdown electrical field, low interface traps, and high temperature stability, as discussed in further detail below. The III-N device with an $Al_{1-x}Si_xO$ gate insulator in combination with a gate electrode formed of a semiconductor material such as TiN or InN can increase the threshold voltage of a III-N device compared to similar devices that include a $Al_2O_3$ gate insulator or a $Al_xSi_yN$ gate insulator.

The amorphous $Al_{1-x}Si_xO$ layer can be grown by using CVD, LPCVD, MOCVD, molecular beam epitaxy (MBE), sputter deposition, or any suitable deposition process. In some examples, the grown amorphous $Al_{1-x}Si_xO$ layer has a thickness of between 1 nm and 100 nm, for example between about 1 nm and 60 nm.

During formation of the $Al_{1-x}Si_xO$ layer, a number of growth or deposition conditions can be optimized to ensure that the resulting $Al_{1-x}Si_xO$ layer is amorphous (rather than polycrystalline). For example, the growth or deposition temperature, chamber pressure, and/or Si/Al ratio in combination with the $N_2$ and $O_2$ ratio can be optimized to realize an amorphous $Al_{1-x}Si_xO$ layer. Generally, decreasing the growth or deposition temperature and increasing the Si/Al ratio tends to cause the deposited $Al_{1-x}Si_xO$ layer to be amorphous, rather than polycrystalline. For example, for a growth or deposition temperature of about 900° C. or higher, the resulting $Al_{1-x}Si_xO$ can be amorphous if the Si/Al ratio is about ¼ or greater, whereas for a growth or deposition temperature of about 700° C. or higher, the resulting $Al_{1-x}Si_xO$ can be amorphous if the Si/Al ratio is about ⅙ or greater. However, it has been found that increasing the growth or deposition temperature, and/or decreasing the Si/Al ratio, in an $Al_{1-x}Si_xO$ gate insulator layer of a III-N enhancement-mode device causes the gate leakage in the device to decrease substantially as long as the $Al_{1-x}Si_xO$ is amorphous (devices with polycrystalline layers have been found to exhibit substantially higher gate leakage). Breakdown voltage of the device with respect to the gate-source bias is reduced for a device that has a gate insulator with a polycrystalline structure compared to a device that has an amorphous $Al_{1-x}Si_xO$ gate insulator layer. Under certain growth conditions, the amorphous $Al_{1-x}Si_xO$ layer can include a nanocrystalline layer at the nitride-oxide interface. This is because the amorphous $Al_{1-x}Si_xO$ layer is directly deposited on a single crystalline nitride surface that has a highly ordered atomic structure. The nanocrystalline layer, if present, can range from a few nanometers to up to 40% of the amorphous $Al_{1-x}Si_xO$ layer thickness. Unlike a polycrystalline layer, a nanocrystalline layer does not generate a strong X-ray diffractions signal, and therefore cannot be measured unambiguously by grazing-incidence X-ray diffraction. The existence of a nanocrystalline layer can be detected, e.g., by high-resolution transmission electron microscopy (TEM) cross sectional imaging. To optimize the device, the minimum Si/Al ratio in the $Al_{1-x}Si_xO$ layer can may be ¼ (e.g. x>0.2). If the Si/Al ratio is too high, for example greater than 4 (e.g. x>0.8), the device can demonstrate characteristics of decreased threshold voltage. In some cases where the threshold voltage is substantially decreased, the threshold voltage ($V_{th}$) can be negative, causing the device to operate in depletion mode, e.g., in the ON state when 0 bias is applied to the gate, instead of in enhancement mode, e.g., in the OFF state when 0 bias is applied to the gate. Hence, the deposition conditions of the $Al_{1-x}Si_xO$ gate insulator layer can be optimized such that a high deposition temperature and an optimized Si/Al ratio are maintained while still achieving an amorphous layer. In some implementations, the growth or deposition temperature of the amorphous $Al_{1-x}Si_xO$ layer is greater than 500° C., for example greater than 800° C. or greater than 900° C., and/or the ratio of the Si fractional composition to the Al fractional composition $(1-x)/x$ is less than 4, for example less than 1, less than ⅓. In one embodiment, the Si/Al ratio is about ⅔, which results in a Si content of about 40%. This ratio can be an optimized ratio to improve threshold voltage and to increase the gate to source breakdown voltage of the transistor. The threshold voltage hysteresis between the positive direction sweep and the negative direction sweep can also be reduced for III-N devices grown with $Al_{1-x}Si_xO$ at an optimized ratio. In some cases, precursor gases can be used in the growth reactor before the growth of the insulator layer, but not during the growth of the insulator layer, to form a sheet acceptor layer. This sheet acceptor layer can increase the charge at the interface between the III-N channel layer and the insulator layer. An example of these gases can include Mg, Fe, Zn or others gases. In some cases, during the growth of the amorphous $Al_{1-x}Si_xO$ layer, different source gases can be injected into the growth reactor, such as $N_2O$, NO, hydrazine and derivatives. These source gases can result in a low concentration of nitrogen being incorporated into the amorphous $Al_{1-x}Si_xO$ layer, where the nitrogen concentration is substantially lower than the concentrations of Al, Si, and O in the layer. Other alternative layers could be used to construct the gate insulator including $Al_2O_3$, or $Al_xSi_yN$. However, the performance of the $Al_{1-x}Si_xO$ layer as a gate insulator can provide III-N device performance advantages that are more desirable to enhancement mode operation.

Figure 8:
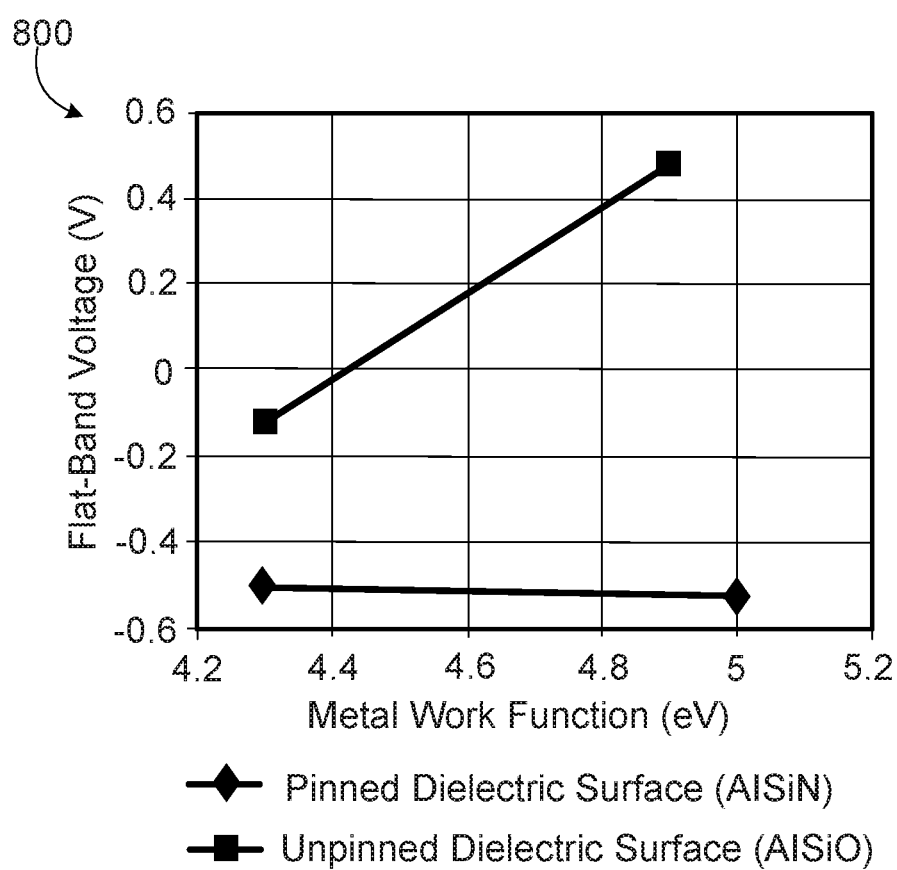
FIG. 8 is diagram showing Flat-Band voltage of gate insulator materials with $Al_{1-x}Si_xO$ and $Al_{1-x}Si_xN$ compared to gate electrode materials with different work functions (eV).

Referring back to FIG. 3A, a gate electrode is formed on the gate insulator (step 304). The gate electrode can be the gate contact 123 of FIG. 1. As noted above, the gate electrode can be formed conformally on the gate insulator at least partially in the recess, by depositing metal stacks, e.g., titanium/aluminum (Ti/Al) or semiconductor materials in combination with metal, e.g., titanium nitride/aluminum (TiN/Al) using metal evaporation or sputtering, and optionally performing a post-gate deposition annealing process. The gate electrode formed with TiN/Al, in this embodiment, can interact with the amorphous $Al_{1-x}Si_xO$ to form an interface which acts to increase the threshold voltage of the III-N device. Typically, when a semiconductor gate electrode with a large work function, such as TiN/Al, is connected to a gate insulator such as $Al_xSi_yN$, the threshold voltage shift is close to zero when compared to a gate electrode with a smaller work function such as titanium/aluminum (Ti/Al) due to Fermi level pinning at the dielectric surface. However, when the disclosed amorphous $Al_{1-x}Si_xO$ is connected to a semiconductor gate electrode such as titanium nitride/aluminum (TiN/Al), the threshold voltage of the III-N device can be increased. This effect is demonstrated using metal-insulator-semiconductor capacitor structures with $Al_xSi_yN$ and $Al_{1-x}Si_xO$ on GaN with gate electrodes composed of various work function materials, as shown in FIG. 8. A post-gate deposition anneal process can be performed in a gas ambient environment including oxygen or forming gas ($H_2+N_2$). The annealing process can be performed at a temperature greater than 400° C. The hydrogen in the forming gas can penetrate through the gate electrode during the annealing process and attached to dangling bonds at the oxide/gate electrode interface. Removing these dangling bonds can improve the oxide interface surface quality. As such, the III-N device can demonstrate improved performance characteristics such as higher $V_{th}$ and hysteresis in the $V_{th}$ swing curve. The gate electrode can include vertical sidewalls in the recess adjacent to the barrier layer and slanted sidewalls in the recess adjacent to the insulator layer. In some implementations, the gate electrode includes extending portions that are outside the recess and extend towards but are separated from the source contact and the drain contact, respectively. These extending portions of the gate electrode can act as field plates to reduce the electric field across the depletion region of the III-N device.

After deposition of the gate electrode, the gate electrode can further be used as an etch mask to etch the gate insulator, such that the gate insulator remains directly beneath the gate contact but is etched away elsewhere, as shown in FIG. 1. Alternatively, the gate insulator 120 can be partially etched as shown in FIG. 6.

Next, the source and drain contacts which are electrically coupled to the channel layer are then formed such that the gate electrode is in between the source and drain contacts (step 306). The source and drain contacts can be the source contact 121 and the drain contact 122 of FIG. 1, respectively. As noted above, the source contact and the drain contact can be formed as metal stacks, e.g., Ti/Al/Ni/Au or Ti/Al, in contact with the channel layer in the III-N device, e.g., by using metal evaporation or sputtering, and optionally performing a post-deposition annealing process. In some cases, the source and drain contacts, respectively, form ohmic contacts electrically contacting or coupled to the conductive channel, e.g., the 2DEG channel, in the channel layer. In some cases, a recess can be formed by dry etching before the deposition of the source and drain contacts. The source and drain contacts are then formed in the recess to allow for lower contact resistance between the metal/III-N interface. The source and drain contacts may optionally be formed prior to forming the recess.

Figure 10:
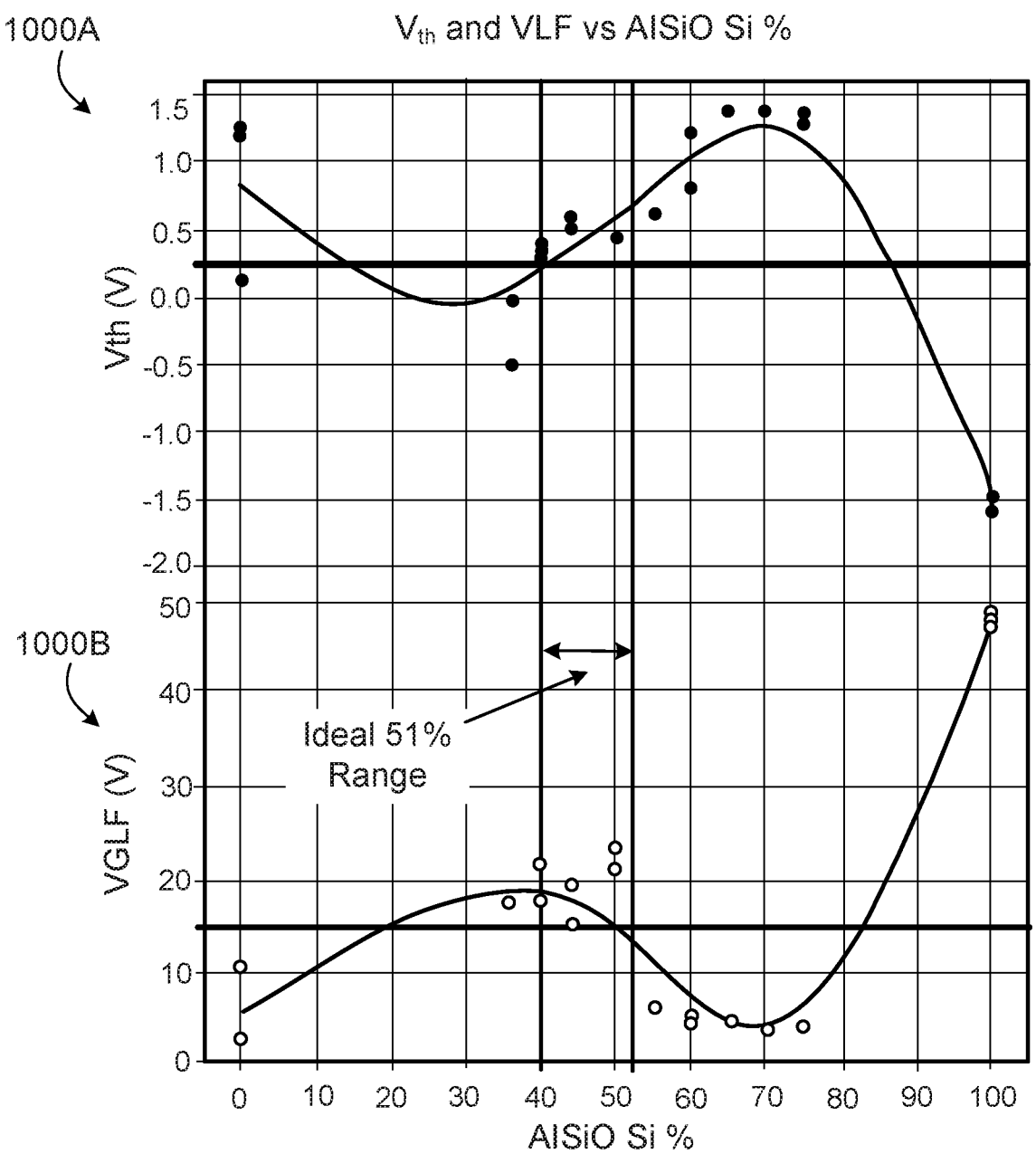
FIG. 10 shows change in threshold voltage and hysteresis for different compositions of $Al_{1-x}Si_xO$.

Metal-oxide-semiconductor enhancement mode III-N power devices have been formed using $Al_2O_3$ as the gate insulator layer. However, III-N devices with $Al_{1-x}Si_xO$ gate insulator layers demonstrate an increase in threshold voltage and a decrease in hysteresis of the gate characteristics, both of which are preferred for enhancement mode operation. The addition of Si to the gate insulator layer can be a difficult task and requires equipment that would not conventionally be needed to deposit high quality $Al_2O_3$ as the gate insulator layer. As the Si content increases beyond an optimized value (as shown in FIG. 10), values of the threshold voltage can become more negative than a value of the threshold voltage corresponding to the optimized Si content value. In addition, $Al_{1-x}Si_xO$ demonstrates an unpinned dielectric interface when used in combination with gate electrode material with a high work function such as titanium nitride, as shown if FIG. 8.

Figure 3B:
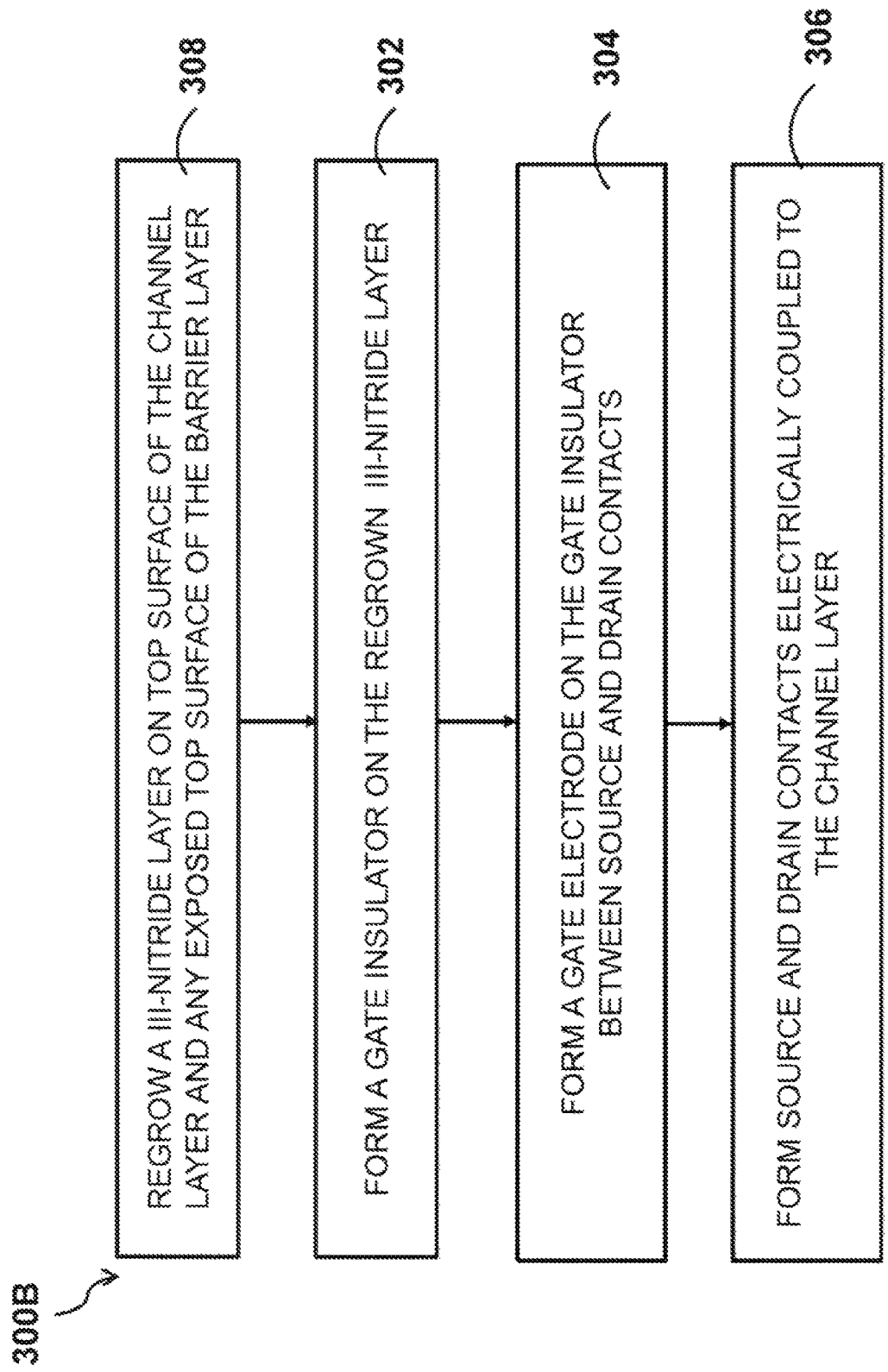

FIG. 3B shows an example process 300B. Process 300B can be performed after process 200A or 200B have been performed for forming III-N device. For instance, the process steps 202, 204, 206, 208, 210, 212 in conjunction with process 300B can be used to form the III-N device 400, 500, or 600 of FIG. 4, FIG. 5 or FIG. 6 respectively. The processing steps 300B of FIG. 3B can be used as an alternative to the process 300A of FIG. 3A to form at least part of the III-N device 400. Process 300B includes the same process steps 302, 304, and 306 of process 300A but includes an additional step 308 to be performed before process step 302.

Referring to FIG. 3B, the process 300B includes regrowing (at step 308) a III-N layer on the top surface of the channel layer, inside the recess formed in process step 210. The regrown III-N layer can act as a III-N capping layer, and can have any one of the examples of compositions described below in connection with FIG. 4. In one embodiment, the III-N capping layer has a composition of AlGaN on the side of the III-N capping layer adjacent to the III-N channel layer and a composition of GaN on the side of the III-N capping layer opposite the III-N channel layer. The III-N capping layer can be a ternary or a quaternary compound such as InAlGaN. In another embodiment, the III-N capping layer can have a composition of AlN on the side of the III-N capping layer adjacent to the III-N channel layer, a middle composition of AlGaN and a composition of GaN on the side of the III-N capping layer opposite the III-N channel layer. The growth of the III-N capping layer can be performed in a MOCVD growth reactor. The III-N capping layer can have a thickness between 1 nm and 10 nm. The thickness of the III-N capping layer is smaller than the thickness of the III-N barrier layer. The III-N barrier layer can have a thickness of up to 30 nm and the regrowth of the III-N capping layer can have a thickness of 1-10 nm, as described above. The III-N capping layer can grow on the sidewalls of the III-N barrier layer, as shown in layer 117 of FIG. 4. In some implementations, precursor gases can be used in the growth reactor before the growth of the III-N capping layer, but not during the growth of the III-N capping layer, to form a sheet acceptor. An example of these gases can include Mg, Fe, Zn or others gases. For example, AlGaN can be grown during an initial phase of the III-N capping layer growth. In a middle phase, Mg gas can be introduced in the growth reactor for a period of time. In a final phase of the III-N capping layer, GaN can be grown that is substantially free of Mg doping. In another embodiment, the III-N capping layer can also include a final composition of a p-type GaN layer on the side of the III-N capping layer opposite the III-N channel layer. This p-type GaN layer can improve the threshold voltage (Vth) of the III-N device to insure proper enhancement mode operation of the device.

Next, an amorphous $Al_{1-x}Si_xO$ gate insulator is formed (at step 302) on the III-N capping layer. For example, the amorphous $Al_{1-x}Si_xO$ gate insulator can be formed using step 302 of process 300A as described above in connection with FIG. 3A for process 300B in connection with FIG. 3B.

In one embodiment, a post deposition anneal can be performed on the III-N device after the gate insulator is formed. The anneal process can be performed in situ, in a growth reactor in which the gate insulator was formed, without exposing the III-N device to air between the forming of the gate insulator and the annealing steps. The anneal process can be performed at a temperature of at least 800° C., e.g., 850° C., 900° C., 950° C. The anneal process can be performed for at least 20 minutes, e.g., 25, 30 or 40 minutes.

In another embodiment, the growth of the III-N capping layer and the growth of the amorphous $Al_{1-x}Si_xO$ gate insulator can be performed in situ in a growth reactor in which the III-N capping layer was grown. In this manner, the III-N device is kept in the growth reactor without being exposed to air between the steps of growing of the III-N capping layer and the forming of the gate insulator.

In yet another embodiment, the III-N capping layer, the amorphous $Al_{1-x}Si_xO$ gate insulator, and the anneal of the III-N device can be performed in a MOCVD growth reactor, in a sequential manner, without exposing the III-N device to air between the steps of growing the III-N capping layer and the forming of the gate insulator; and between the steps of forming the gate insulator and the annealing.

After the formation of a III-N capping layer, the growth reactor typically needs to be conditioned to allow for safe growth of an oxide layer. Hydrogen gas present during the III-N capping layer growth must be purged from the MOCVD reactor before Oxygen source gases can be used. This can require removal of the III-N device from the growth reactor after the deposition of the III-N capping layer and before the deposition of the amorphous $Al_{1-x}Si_xO$ gate insulator. Exposing the III-N device to the atmosphere can result in defect formation or formation of an unintended oxidation layer to on the III-N capping layer. These defects and/or oxidization layer can result in degraded device performance and particularly in degradation in device performance preferred for enhancement mode operation. Poor surface quality of the III-N device interface between the channel layer 114, the regrowth III-N capping layer 117, and the gate insulator 120 can result in a reduced threshold voltage shift and increased surface charge trapping. The increased surface charge trapping at the device interfaces described above can have the effect of increased on-resistance $R_{on}$, particularly during switching operation of the III-N device.

Referring back to FIG. 3B, a gate electrode is formed (at step 304) on the gate insulating layer. The gate electrode can be formed using step 304 of process 300A described above in connection with FIG. 3A. As noted above, the gate electrode can be formed conformally on the gate insulator at least partially in the recess, by depositing metal stacks, e.g., titanium/aluminum (Ti/Al) or semiconductor materials in combination with metal, e.g., titanium nitride/Aluminum (TiN/Al) using metal evaporation or sputtering, and optionally performing a post-gate deposition annealing process. In a particular embodiment, the gate electrode is formed with titanium nitride and aluminum (TiN/Al). The titanium nitride can be deposited by sputtering without exposure to air with the aluminum (Al). The aluminum top metal can act as a conductive layer to enhance the electron mobility of the gate electrode.

In addition, referring back to steps 308, 302, and 304 of process 300B, these steps performed together can result in decreased surface trapping at the interface of the III-N channel layer and the III-N capping layer. The amorphous $Al_{1-x}Si_xO$ layer in combination with the semiconductor gate material such as TiN/Al, can result in improved III-N device threshold voltage compared to using conventional gate insulators such as $Al_xSi_yN$.

Referring back to FIG. 3B, the source and drain contacts are formed (at step 306) in a manner that is similar to step 306 of process 300A described above in connection with FIG. 3A. In some implementations, the source and drain contacts can be formed of the same materials and using the same processes as described in process 300A. The benefits of having the recessed ohmic contacts apply to the formation of the III-N device described in the process 300A.

Figure 4:
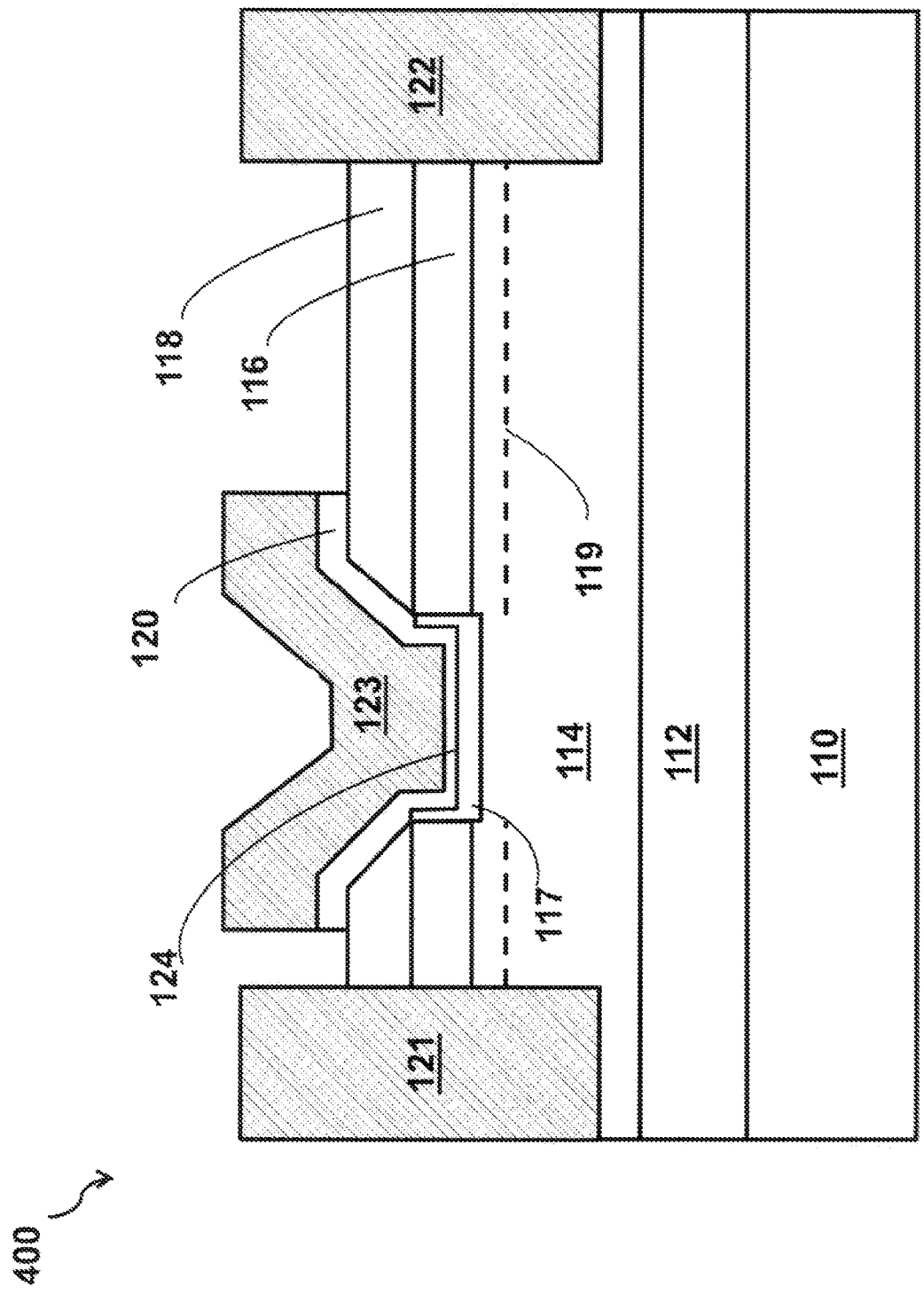
FIG. 4 is a cross-sectional view of an example of a III-N device.

FIG. 4 is a cross sectional view of an example III-N device 400. Device 400 is similar to device 100 of FIG. 1, except that device 400 includes a III-N capping layer 117 formed in the recess 124, on the top surface of the channel layer 114. The gate insulator 120 is formed on the III-N capping layer 117, as shown in FIG. 4.

Layers of device 400 each have the same properties as the respective like numbered layers of device 100 of FIG. 1, and can therefore be the same materials and formed using the same methods previously described with the reference to device 100 of FIG. 1. The processes used to create the III-N device 400 can be the process 200A (without optional step 210) in combination with process 300B, as described above. The III-N capping layer 117 can have different compositions of III-N materials compared to the channel layer 114 and the barrier layer 116. The III-N capping layer 117 can have a lower ratio of Al than that of the III-N barrier layer 116. The III-N capping layer 117 can be GaN or AlGaN. The III-N capping layer 117 can be a ternary or a quaternary compound such as InAlGaN. In some implementations, the III-N capping layer 117 can have a composition of AlGaN on a side of the III-N capping layer adjacent to the III-N channel layer and GaN on the side of the III-N capping layer opposite the III-N channel layer. The III-N capping layer 117 can also be doped to form a p-type GaN layer or a doped AlGaN layer. In yet another implementation, the capping layer 117 can include a composition of AlN/AlGaN/GaN, where the AlN layer is on a side of the III-N capping layer adjacent to the III-N channel layer. A preferred embodiment of the III-N capping layer is an initial composition of AlGaN adjacent the III-N channel layer and a final composition of p-type GaN adjacent the gate insulator layer 120.

The III-N capping layer 117 is deposited after the formation of the recess 124 in the III-N device. Dry etching techniques used to form the recess 124 can cause ion bombardment damage, which can reduce the channel carrier mobility. The ion bombardment damage on the surface of the channel layer 114 can be repaired by adding the III-N capping layer 117 after the formation of the recess 124 in a first portion of the device. Additionally, the capping layer 117 can improve the channel mobility by inserting a III-N heterojunction between the gate dielectric and the channel material. In a particular embodiment, the formation of the recess 124 includes partially etching the III-N channel layer 114 in a first portion of the device. This portion of the etched channel can be replaced by the III-N capping layer. The III-N capping layer 117 can be important to optimize the depth of the recess 124 to ensure the device realizes enhancement mode operation. The III-N capping layer can grow on the sidewalls of the III-N barrier layer, as shown in layer 117 of FIG. 4. The gate insulator 120 is formed on the III-N capping layer 117 in the recess instead of directly on the III-N channel layer 114 as in the device 100 of FIG. 1. The gate insulator 120 can have the same shape and properties as the gate insulator of device 100 in FIG. 1.

Figure 5:
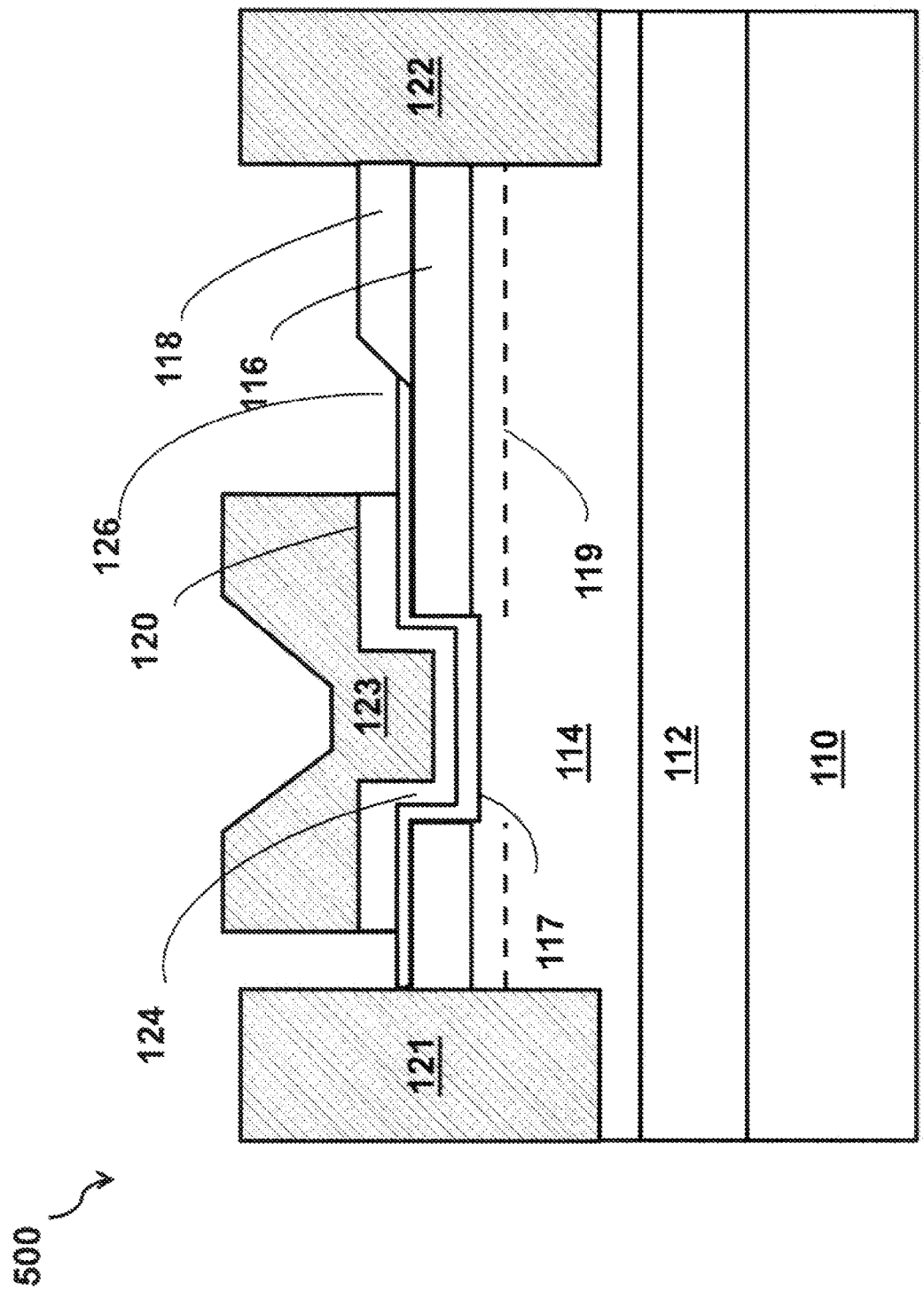
FIG. 5 is a cross-sectional view of another example of a III-N device.

FIG. 5 is a cross-sectional view of another III-N device 500. Device 500 is similar to device 400 of FIG. 4, except that device 500 has been created using the optional process step 210 described in process 200A. Process step 210 includes partially removing the insulator layer 118 before forming the trench 124. Partially removing the insulator layer 118 can result in the formation of region 126 in FIG. 5. The insulator layer 118 may only remain in an area near the drain 122 in a region of the device between the gate and the drain. The width of the insulator layer 118 removed can be 2 times the width of the recess 124 or up to 50 times the width of the recess 124. The regrowth of the III-N capping layer 117 in the recess 124 can be problematic to perform due to the small open area of the recess compared to the overall distance between the source contact 121 and the drain contact 122. Since the III-N capping layer tends to not grow on the insulator layer 118, the growth rate of the III-capping layer 117 in the recess 124 can be very high and difficult to control due to the masking effect with a small percent open area. Removing the insulator layer 118 with a greater width than the recess 124 can reduce the growth rate of the III-N capping layer 117, by making a larger percent open area, and make the deposition thickness more accurate. As a result, the III-N capping layer can grow on the exposed top surface of the III-N barrier layer 116 created by the removal of the insulator layer 118 in the area 126. Poor control of the thickness of the III-N capping layer can affect the threshold voltage of the device. If the III-N capping layer is too thick, the threshold voltage of the device can increase, causing the device to operate in depletion mode instead of enhancement mode, as desired. The gate insulator layer 120 is then formed over the III-N capping layer 117. The gate insulator 120 can extend all the way from the source contact 121 to the drain contact 122. Next, the gate contact 123 is formed conformally on the gate insulator 120 at least partially in the recess 124. Finally, the gate contact 123 can be used as an etch mask to etch the gate insulator 120, such that the gate insulator 120 remains directly beneath the gate contact 123 but is etched away everywhere else. Alternatively, the gate insulator can be etched away only over the insulator layer 118 but remain over the III-N capping layer 117 (not shown), or the gate insulator can be partially etched away and still remain over the entire active area between the source contact 121 and the drain contact 122 (not shown).

FIG. 6 is a cross-sectional view of another III-N device 600. Device 600 is similar to device 500 of FIG. 5, except that, while device 500 has been created by completely removing the insulator layer 118 using the optional process step 210 described in process 200A of FIG. 2A, device 600 can be created by following process 200B of FIG. 2B, which does not include forming the insulator layer on the barrier layer, as described in process step 208 of process 200A. Next, process 300B is followed and the III-N capping layer 117 is grown directly on the channel layer 116 from the source 121 to the drain 122. The insulator layer 120 is over the III-N capping layer 117. In this embodiment, the insulator layer 120 is typically only partially etched in a region outside the gate electrode 123 in order to passivate the III-N capping layer 117. In a preferred embodiment for device 600, the III-N barrier layer 116 can have an initial composition of $Al_xGa_{1-x}N$ and a final composition of GaN and is substantially free of Al at the top surface of the III-N barrier layer.

Figure 7:
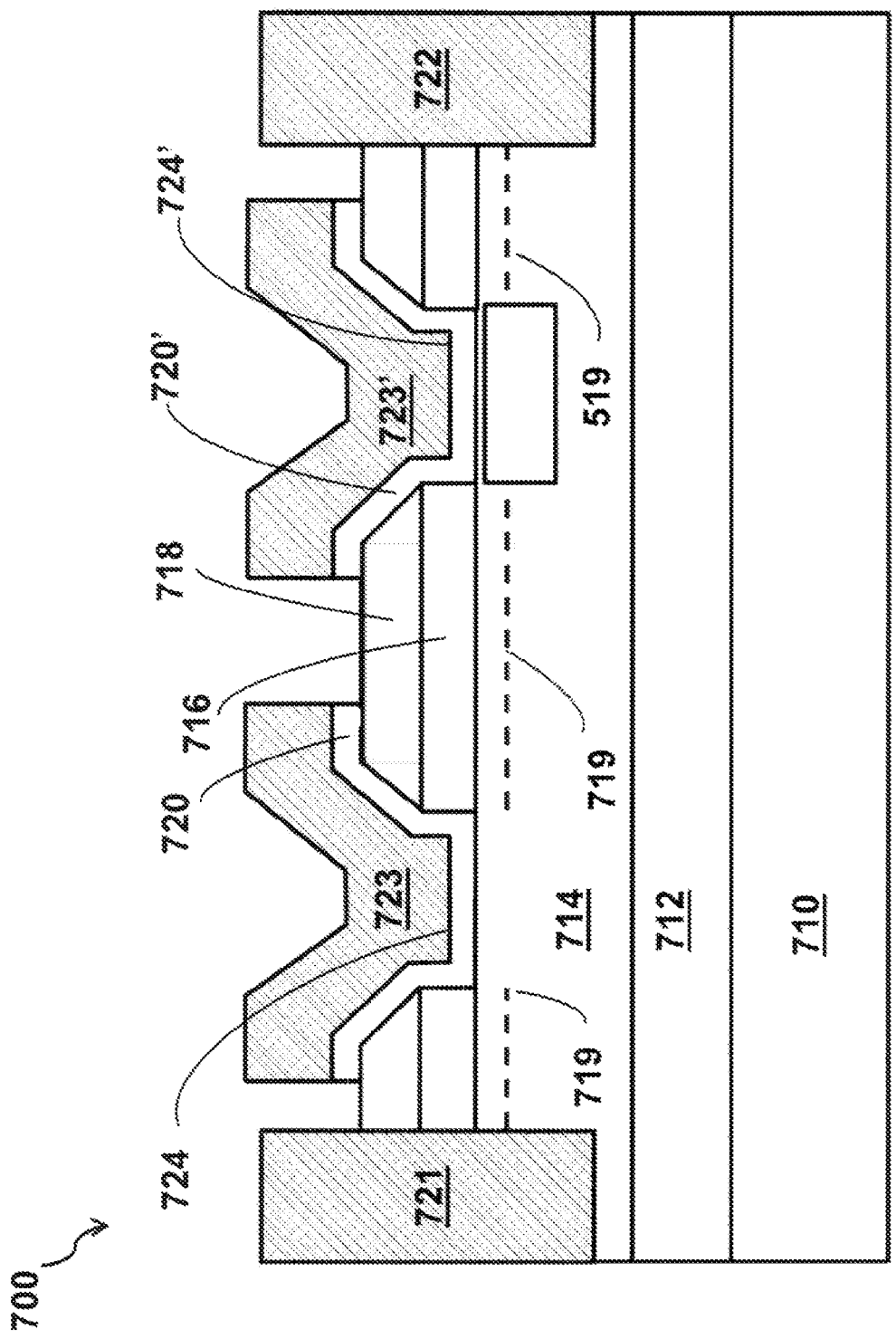
FIG. 7 is a cross-sectional view of yet another example of a III-N device.

FIG. 7 is a cross-sectional view of another III-N device 700. Device 700 is similar to device 100 of FIG. 1, except that device 700 includes two gate electrodes 723 and 723' between the power electrodes 721 and 722. Device 700 can be operated as a bidirectional switch (i.e., a four quadrant switch or FQS), where voltages on the first gate electrode 723 are applied relative to the first power electrode 721, voltages on the second gate electrode 723' are applied relative to the second power electrode 722, and power electrodes 721 and 722 are each operated as a source and a drain of the device 700 (depending on the polarity of the voltage across the device and/or the direction of current flow).

Layers 710, 712, 714, 716, and 718 of device 700 each have the same properties as respective layers 110, 112, 114, 116, and 118 of the device of FIG. 1, and can therefore be the same materials and formed using the same methods previously described with reference to device 100 of FIG. 1. Recesses 724 and 724' can each have the same shape and properties as recess 124 in FIG. 1, and can be formed by the same methods as those described with reference to device 100 of FIG. 1. Gate electrodes 723 and 723', as well as their respective gate insulator layers 720 and 720', can each have the same shape and properties as gate insulator layers 120 in FIG. 1, and can be formed by the same methods and/or from the same materials as those described with reference to device 100 of FIG. 1.

FIG. 8 shows flat-band voltages 800 of gate electrode materials with different work functions. As show in the FIG. 8, the flat-band voltage of a gate insulator layer formed of $Al_xSi_yN$ is relatively unchanged for the range of metal work functions. However, the flat-band voltage of a gate insulator layer formed of $Al_{1-x}Si_xO$ has a strong positive correlation as the metal work function increases. The gate electrode corresponding to the metal work function of 4.3 eV in this figure is Ti/Al. The gate electrode corresponding to the metal work function of 4.9 eV and 5.0 eV in this figure is TiN and Ni respectively. The $Al_{1-x}Si_xO$ has an unpinned dielectric surface with the metal, whereas the $Al_xSi_yN$ dielectric surface is pinned due to fermi level pinning. Measurements in FIG. 8 show that a III-N device with $Al_{1-x}Si_xO$ in combination with a gate electrode material with a high work function such as TiN can achieve much better device performance, e.g., higher threshold voltage, than a III-N device using $Al_{1-x}Si_xN$ as the gate insulator layer.

Figure 9B:
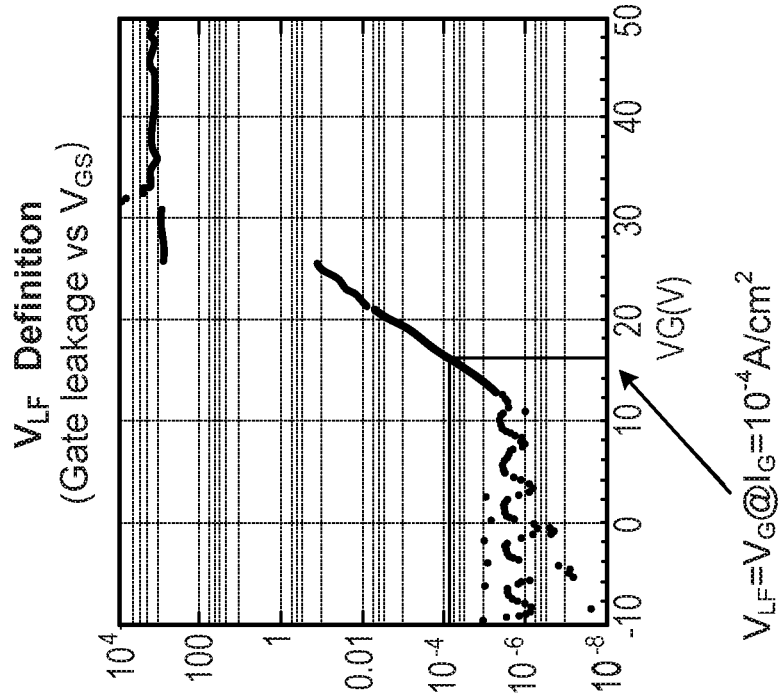
FIG. 9B indicates the measurement definition of $V_{LF}$ from FIG. 9A.
Figure 9A:
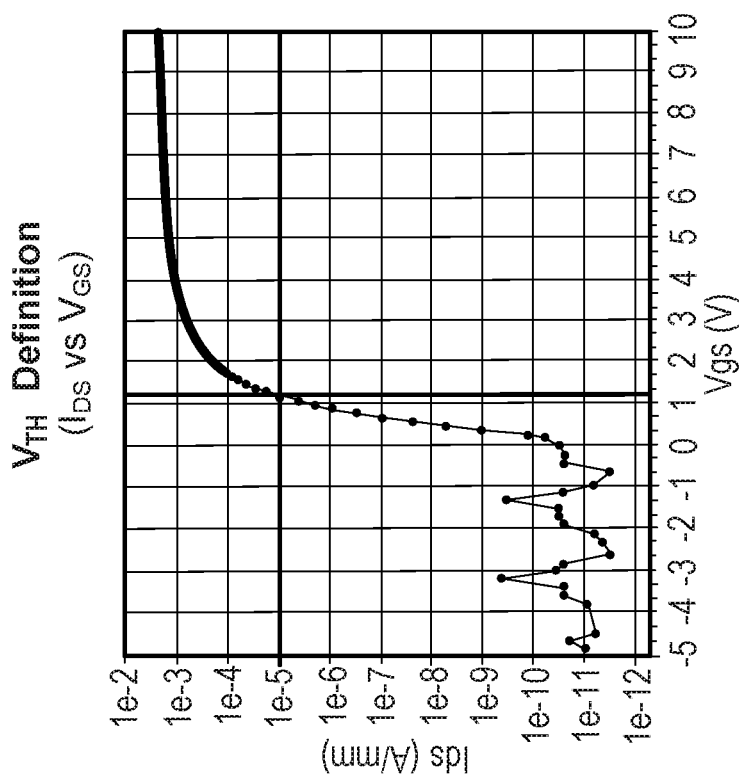
FIG. 9A is a diagram showing low field voltage ($V_{LF}$) of a III-N device with $Al_{1-x}Si_xO$ and $Al_{1-x}Si_xN$ for varying Si composition.

FIG. 9A defines the criteria for the $V_{TH}$ measurement shown in FIG. 10. As shown in FIG. 9A, $V_{TH}$ is defined as $V_{GS}$ with $I_{DS}$ @$10^{-5}$ A/mm ($V_{TH}=V_{GS}$@$10^{-5}$ A/mm). FIG. 9B shows criteria for determining the low field voltage ($V_{LF}$) limit for the metal-insulator-semiconductor capacitor structure measurement shown in FIG. 10. At a relatively low $V_G$ (−10V to 10V), the gate leakage is constant and low. As $V_G$ increases (>10V) the gate leakage increases until the device reaches catastrophic breakdown. The $V_G$ which corresponds to a gate leakage ($I_G$) of $10^{-4}$ A/cm2 is used to define $V_{LF}$. Device operation is preferable in a low field range. Operation outside the low field range can result in device instability and hole injection into the gate insulator dielectric. This area of operation can also demonstrate characteristics of greater hysteresis compared to device operation with the $V_{LF}$ range.

FIG. 10 shows a first graph 1000A of the change in threshold voltage (VIE), and a second graph 1000B of the low field voltage ($V_{LF}$), of a III-N device with an $Al_{1-x}Si_xO$ gate insulator layer for varying dielectric composition of Si, where x corresponds to the % Si shown in the figure. The first graph 1000A shows that $V_{TH}$ increases as the Si content increases from 30-80% and decreases as the Si content approaches 100%. The $V_{TH}$ of a III-N device must be positive to demonstrate enhancement mode operation. A minimum preferable $V_{TH}$ value for stable operation is indicated in the first graph 1000A by the horizontal line with a value of ~0.35V. The second graph 1000B shows the low field voltage ($V_{LF}$) increases from 0%-50% Si and then decreases as the Si value approaches 80%. A dielectric layer with 100% Si ($SiO_2$) typically shows a very high $V_{LF}$ but with undesirable $V_{TH}$. A minimum preferable $V_{LF}$ value for stable operation is indicated in the second graph 1000B by a horizontal line with a value of ~15V. To design a III-N device which is optimized for Si content, high $V_{TH}$ in combination with high $V_{LF}$ must be considered. As indicated in the combination of graphs 1000A and 1000B of FIG. 10, an ideal Si % range which meets the performance requirements of $V_{TH}$ and $V_{LF}$ is between about 40%-50% Si content of the $Al_{1-x}Si_xO$ gate insulator layer.

A number of implementations have been described. Nevertheless, it will be understood that various modifications may be made without departing from the spirit and scope of the techniques and devices described herein. Features shown in each of the implementations may be used independently or in combination with one another. Accordingly, other implementations are within the scope of the following claims.

What is claimed is:

1. A transistor comprising:
   a III-N channel layer;
   a III-N barrier layer on the III-N channel layer;
   a source contact and a drain contact, the source and drain contacts electrically coupled to the III-N channel layer;
   an insulator layer on the III-N barrier layer;
   a gate insulator partially on the insulator layer and partially on the III-N channel layer, the gate insulator including an amorphous $Al_{1-x}Si_xO$ layer with 0.2<x<0.8, wherein the amorphous $Al_{1-x}Si_xO$ layer includes a nanocrystalline $Al_{1-x}Si_xO$ portion on a side adjacent the III-N channel layer; and
   a gate electrode over the gate insulator, the gate electrode being positioned between the source and drain contacts.

2. The transistor of claim 1, wherein a thickness of the amorphous $Al_{1-x}Si_xO$ layer is between about 1 nm and 100 nm.

3. The transistor of claim 1, wherein the gate electrode comprises a semiconductor material.

4. The transistor of claim 1, wherein the gate electrode comprises titanium nitride (TiN), indium nitride (InN), p-type poly silicon, tungsten nitride (WN), or indium tin oxide (ITO).

5. The transistor of claim 4, wherein a composition of the gate electrode is selected such that at room temperature, a threshold voltage of the transistor is greater than 2 V and a threshold voltage hysteresis is less than 0.5 V.

6. The transistor of claim 5, wherein the transistor is configured such that in operation, an off state blocking voltage of the transistor is greater than 600V.

7. The transistor of claim 1, wherein a recess in a first portion of the transistor extends through the insulator layer and the III-N barrier layer.

8. The transistor of claim 7, wherein the gate insulator is at least partially in the recess and contacts the III-N channel layer in the recess.

9. The transistor of claim 8, wherein the gate electrode is at least partially in the recess.

10. The transistor of claim 1, wherein a thickness of the nanocrystalline $Al_{1-x}Si_xO$ portion is less than 40% of a thickness of the amorphous $Al_{1-x}Si_xO$ layer.

11. The transistor of claim 1, wherein the amorphous $Al_{1-x}Si_xO$ layer includes nitrogen.

12. A method of fabricating a III-N device, comprising:
   providing a material structure comprising
      a III-N barrier layer on a III-N channel layer, and
      an insulator layer on the III-N barrier layer;
   forming a recess in a first portion of the device, the forming of the recess comprising removing the insulator layer and the III-N barrier layer in the first portion of the device to expose the III-N channel layer in the first portion of the device;
   forming an amorphous $Al_{1-x}Si_xO$ layer at least partially in the recess, wherein the amorphous $Al_{1-x}Si_xO$ layer is formed over the channel layer in the first portion of the device; and
   forming a gate electrode on the amorphous $Al_{1-x}Si_xO$ layer at least partially in the recess, wherein the gate electrode comprises a compound semiconductor material and a metal;
   wherein forming the amorphous $Al_{1-x}Si_xO$ layer includes forming a nanocrystalline $Al_{1-x}Si_xO$ portion on a side adjacent the III-N channel layer.

13. The method of claim 12, wherein the forming of the amorphous $Al_{1-x}Si_xO$ layer is performed using a metal organic chemical vapor deposition (MOCVD) growth reactor.

14. The method of claim 12, further comprising annealing the III-N device at an elevated temperature.

15. The method of claim 14, wherein the forming of the amorphous $Al_{1-x}Si_xO$ layer and the annealing of the III-N device is performed sequentially without exposure to air in a MOCVD growth reactor.

16. The method of claim 14, wherein the annealing of the III-N device is performed at a temperature greater than 800° C.

17. The method of claim 12, wherein the gate electrode includes titanium nitride (TiN), indium nitride (InN), p-type poly silicon, tungsten nitride (WN), or indium tin oxide (ITO).

18. The method of claim 12, further comprising annealing the III-N device in forming gas after the forming of the gate electrode.

19. The method of claim 18, wherein the annealing is performed at a temperature greater than 350° C.

20. The method of claim 12, wherein the forming of the amorphous $Al_{1-x}Si_xO$ layer is performed at a deposition temperature greater than 500° C.

21. The method of claim 12, wherein a thickness of the nanocrystalline $Al_{1-x}Si_xO$ portion is less than 40% of a thickness of the amorphous $Al_{1-x}Si_xO$ layer.

22. The method of claim 12, wherein forming the amorphous $Al_{1-x}Si_xO$ layer includes incorporating nitrogen into the amorphous $Al_{1-x}Si_xO$ layer to form an $Al_{1-x}Si_xON$ layer.

\* \* \* \* \*